United States Patent
Bower et al.

(10) Patent No.: US 12,249,532 B2
(45) Date of Patent: Mar. 11, 2025

(54) MULTI-LEVEL MICRO-DEVICE TETHERS

(71) Applicant: X Display Company Technology Limited, Dublin (IE)

(72) Inventors: Christopher Andrew Bower, Raleigh, NC (US); Matthew Meitl, Durham, NC (US); Salvatore Bonafede, Chapel Hill, NC (US); Brook Raymond, Cary, NC (US); Carl Ray Prevatte, Jr., Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 18/140,427

(22) Filed: Apr. 27, 2023

(65) Prior Publication Data
US 2023/0343630 A1    Oct. 26, 2023

Related U.S. Application Data

(60) Continuation of application No. 16/921,556, filed on Jul. 6, 2020, now Pat. No. 11,670,533, which is a
(Continued)

(51) Int. Cl.
*H01L 21/683*    (2006.01)
*B41F 16/00*    (2006.01)
(Continued)

(52) U.S. Cl.
CPC .......... *H01L 21/6835* (2013.01); *B41F 16/00* (2013.01); *H01L 21/67144* (2013.01);
(Continued)

(58) Field of Classification Search
None
See application file for complete search history.

(56) References Cited

U.S. PATENT DOCUMENTS

| | | | |
|---|---|---|---|
| 3,673,471 | A | 6/1972 | Klein et al. |
| 5,475,224 | A | 12/1995 | Koh |

(Continued)

FOREIGN PATENT DOCUMENTS

| | | |
|---|---|---|
| JP | 2005108943 A | 4/2005 |
| JP | 2005259912 A | 9/2005 |

(Continued)

OTHER PUBLICATIONS

Cok, R. S. et al., AMOLED displays with transfer-printed integrated circuits, Journal of the SID, 19(4):335-341, (2011).
(Continued)

*Primary Examiner* — Hung K Vu
(74) *Attorney, Agent, or Firm* — Choate, Hall & Stewart LLP; Michael D. Schmitt

(57) ABSTRACT

An exemplary wafer structure comprises a source wafer having a patterned sacrificial layer defining anchor portions separating sacrificial portions. A patterned device layer is disposed on or over the patterned sacrificial layer, forming a device anchor on each of the anchor portions. One or more devices are disposed in the patterned device layer, each device disposed entirely over a corresponding one of the one or more sacrificial portions and spatially separated from the one or more device anchors. A tether structure connects each device to a device anchor. The tether structure comprises a tether device portion disposed on or over the device, a tether anchor portion disposed on or over the device anchor, and a tether connecting the tether device portion to the tether anchor portion. The tether is disposed at least partly in the patterned device layer between the device and the device anchor.

14 Claims, 18 Drawing Sheets

Related U.S. Application Data division of application No. 16/058,097, filed on Aug. 8, 2018, now Pat. No. 10,832,935.

(60) Provisional application No. 62/545,413, filed on Aug. 14, 2017.

(51) Int. Cl.
*H01L 21/67* (2006.01)
*H01L 33/00* (2010.01)
*H01L 27/15* (2006.01)

(52) U.S. Cl.
CPC ...... *H01L 33/0093* (2020.05); *H01L 33/0095* (2013.01); *H01L 27/15* (2013.01); *H01L 2221/68359* (2013.01); *H01L 2221/68363* (2013.01); *H01L 2221/68381* (2013.01)

(56) References Cited

U.S. PATENT DOCUMENTS

| | | |
|---|---|---|
| 5,621,555 A | 4/1997 | Park |
| 5,815,303 A | 9/1998 | Berlin |
| 5,882,532 A | 3/1999 | Field et al. |
| 6,051,472 A | 4/2000 | Abiko et al. |
| 6,142,358 A | 11/2000 | Cohn et al. |
| 6,278,242 B1 | 8/2001 | Cok et al. |
| 6,577,367 B2 | 6/2003 | Kim |
| 6,717,560 B2 | 4/2004 | Cok et al. |
| 6,756,576 B1 | 6/2004 | McElroy et al. |
| 6,933,532 B2 | 8/2005 | Arnold et al. |
| 7,129,457 B2 | 10/2006 | McElroy et al. |
| 7,195,733 B2 | 3/2007 | Rogers et al. |
| 7,288,753 B2 | 10/2007 | Cok |
| 7,354,801 B2 | 4/2008 | Sugiyama et al. |
| 7,399,693 B2 | 7/2008 | Sekiguchi et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,779,484 B2 | 7/2014 | Shen et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,987,765 B2 | 3/2015 | Bibl et al. |
| 9,142,468 B2 | 9/2015 | Bower et al. |
| 9,161,448 B2 | 10/2015 | Menard et al. |
| 9,355,854 B2 | 5/2016 | Meitl et al. |
| 9,434,150 B2 | 9/2016 | Bower et al. |
| 9,520,537 B2 | 12/2016 | Bower et al. |
| 9,601,356 B2 | 3/2017 | Bower et al. |
| 9,761,754 B2 | 9/2017 | Bower et al. |
| 9,923,133 B2 | 3/2018 | Bower et al. |
| 9,929,053 B2 | 3/2018 | Bower et al. |
| 9,947,584 B2 | 4/2018 | Bower et al. |
| 10,832,935 B2 | 11/2020 | Bower et al. |
| 11,670,533 B2 | 6/2023 | Bower et al. |
| 2003/0062580 A1 | 4/2003 | Sato et al. |
| 2003/0141570 A1 | 7/2003 | Chen et al. |
| 2006/0063309 A1 | 3/2006 | Sugiyama et al. |
| 2006/0079010 A1 | 4/2006 | Hara et al. |
| 2006/0145177 A1 | 7/2006 | Hagimoto et al. |
| 2007/0032089 A1 | 2/2007 | Nuzzo et al. |
| 2007/0173034 A1 | 7/2007 | Tsurume et al. |
| 2007/0281556 A1 | 12/2007 | Elliott et al. |
| 2008/0079246 A1 | 4/2008 | Dix |
| 2008/0108171 A1 | 5/2008 | Rogers et al. |
| 2009/0202089 A1 | 8/2009 | Zhang et al. |
| 2010/0248484 A1 | 9/2010 | Bower et al. |
| 2010/0306993 A1 | 12/2010 | Mayyas et al. |
| 2010/0317132 A1 | 12/2010 | Rogers et al. |
| 2010/0326518 A1 | 12/2010 | Juso et al. |
| 2012/0228669 A1 | 9/2012 | Bower et al. |
| 2012/0314388 A1 | 12/2012 | Bower et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0264763 A1 | 9/2014 | Meitl et al. |
| 2014/0267683 A1 | 9/2014 | Bibl et al. |
| 2014/0340900 A1 | 11/2014 | Bathurst et al. |
| 2014/0367633 A1 | 12/2014 | Bibl et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0137187 A1 | 5/2015 | Aoki et al. |
| 2015/0371874 A1 | 12/2015 | Bower et al. |
| 2015/0372053 A1 | 12/2015 | Bower et al. |
| 2016/0020131 A1 | 1/2016 | Bower et al. |
| 2016/0086855 A1 | 3/2016 | Bower et al. |
| 2016/0093600 A1 | 3/2016 | Bower et al. |
| 2017/0047306 A1 | 2/2017 | Meitl et al. |
| 2017/0154819 A1 | 6/2017 | Bower et al. |
| 2017/0173852 A1 | 6/2017 | Moore et al. |
| 2017/0256521 A1 | 9/2017 | Cok et al. |
| 2017/0287882 A1* | 10/2017 | Cok ............... H01L 25/50 |
| 2018/0096964 A1 | 4/2018 | Bonafede et al. |

FOREIGN PATENT DOCUMENTS

| | | |
|---|---|---|
| JP | 2006108441 A | 4/2006 |
| JP | 2009105450 A | 5/2009 |
| JP | 2011066130 A | 3/2011 |
| WO | WO-2008/036837 A2 | 3/2008 |
| WO | WO-2008/103931 A2 | 8/2008 |
| WO | WO-2011/123285 A1 | 10/2011 |
| WO | WO-2015/193435 A1 | 12/2015 |

OTHER PUBLICATIONS

Cok, R. S. et al., Inorganic light-emitting diode displays using micro-transfer printing, Journal of the SID, 25(10):589-609, (2017).

Delmdahl, R. et al., Large-area laser-lift-off processing in micro-electronics, Physics Procedia 41:241-248 (2013).

(56) References Cited

OTHER PUBLICATIONS

Lothian, J. R. et al., Wet and Dry Etching Characteristics of $Al_{0.5}In_{0.5}P$, Journal of Vacuum Science & Technology B, Microelectronics Processing and Phenomena USA, 10(3):1061-1065 (1992).
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).
Yazawa, Y. et al., GaInP Single-Junction and GaInP/GaAs Two-Junction Thin-Film Solar Cell Structures by Epitaxial Lift-Off, Solar Energy Materials and Solar Cells, Elsevier Science Publishers, Amsterdam, 50(1-4):229-235 (1998).

\* cited by examiner

MULTI-LEVEL MICRO-DEVICE TETHERS

PRIORITY APPLICATIONS

The present application is a continuation of U.S. patent application Ser. No. 16/921,556, filed on Jul. 6, 2020, entitled Multi-Level Micro-Device Tethers, which is a division of U.S. patent application Ser. No. 16/058,097, filed on Aug. 8, 2018, entitled Multi-Level Micro-Device Tethers, which claims the benefit of U.S. Provisional Patent Application No. 62/545,413, filed on Aug. 14, 2017, entitled Multi-Level Micro-Device Tether, the disclosure of each of which is hereby incorporated by reference herein in its entirety.

TECHNICAL FIELD

The present invention generally relates to structures and methods for micro-transfer printing micro-devices from source wafers.

BACKGROUND

Heterogeneous device assembly is a technology that enables the integration of different kinds of devices incorporating different materials into a common structure or onto a common substrate. Heterogeneous micro-devices can comprise different materials, made with incompatible processes and are not readily integrable on a common substrate using conventional photolithographic materials and deposition techniques. For example, highly integrated silicon devices, such as CMOS, are difficult to combine with devices made in compound semiconductors such as gallium arsenide or gallium nitride, or with devices made on non-semiconductor substrates such as sapphire.

Conventional electronic assembly methods rely on pick-and-place technologies, for example for surface-mount components, and can assemble a wide variety of devices, such as integrated circuits, capacitors, resistors, and inductors. However, such components have a size limitation and are not typically made or assembled in packages with lateral dimensions smaller than about 400 microns. Since smaller packages and structures are desirable to reduce the size of electronic and optical systems, there exists a need for heterogeneous micro-device assembly for devices with microscopic sizes, for example having lengths or widths from one micron to 400 microns.

Such a method for transferring active components from one substrate to another is described in "AMOLED Displays using Transfer-Printed Integrated Circuits" published in the Journal of the Society for Information Display, 2011, DOI #10.1889/JSID19.4.335, 1071-0922/11/1904-0335, pages 335-341. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458, entitled Optical Systems Fabricated by Printing-Based Assembly, teaches transferring light-emitting, light-sensing, or light-collecting semiconductor elements from a wafer substrate to a destination substrate or backplane.

Exemplary methods for heterogeneous micro-device assembly are described further in U.S. Pat. No. 7,943,491 entitled "Pattern Transfer Printing by Kinetic Control of Adhesion to an Elastomeric Stamp." In this disclosure, a method of transferring a feature from a donor substrate surface to a receiving surface of a receiving substrate comprises providing an elastomeric transfer device having a transfer surface, providing a donor substrate having a donor surface, the donor surface having at least one feature, contacting at least a portion of the transfer surface with at least a portion of the feature, separating the transfer surface from the donor surface at a first separation rate such that at least a portion of the feature is transferred from the donor surface to the transfer surface, thereby forming the transfer surface having the feature disposed thereon, contacting at least a portion of the feature disposed on the transfer surface with the receiving surface of the receiving substrate, and separating the transfer surface from the feature at a second separation rate to transfer the feature to the receiving surface. The first separation rate is larger than the second separation rate.

Features, such as micro-devices, can be held in place on a donor surface with tethers or bridge elements connecting the micro-devices to anchor portions of the donor surface. For example, U.S. Pat. No. 8,039,847, entitled "Printable Semiconductor Structures and Related Methods of Making and Assembling," describes a printable semiconductor structure comprising a printable semiconductor element and a bridge element (tether) connected to the printable semiconductor element and connected to a mother wafer. The printable semiconductor element and the bridge element are at least partially undercut from the mother wafer so that contacting the printable semiconductor element with a transfer device (such as a PDMS stamp) fractures the bridge element and releases the printable semiconductor element from the mother wafer.

In such methods, it is important that the micro-transfer printing process is reliable and repeatable. Moreover, particulate generation or contamination can inhibit a micro-transfer printing process. It is important that the printing process is repeatable, provides consistent results, and is contamination free. There is a need, therefore, for structures and methods that enable reliable and repeatable micro-transfer printing from a source wafer without generating contaminating particles.

SUMMARY

In one aspect, the present invention is directed to a wafer structure comprises a source wafer having a patterned sacrificial layer defining one or more anchor portions separating one or more sacrificial portions, a patterned device layer disposed at least partially on or over the patterned sacrificial layer forming a device anchor disposed on each of the one or more anchor portions, one or more devices disposed in the patterned device layer, each device disposed entirely over a corresponding one of the one or more sacrificial portions and spatially separated from the one or more device anchors, and a tether structure connecting each of the one or more devices to the device anchor disposed on one of the one or more anchor portions, the tether structure comprising a tether device portion disposed at least partly on or over the device, a tether anchor portion disposed at least partly on or over the device anchor, and a tether connecting the tether device portion to the tether anchor portion, wherein each tether structure is physically continuous and the tether is disposed at least partly in the patterned device layer between the device and the device anchor. In some embodiments, at least a portion of the tether is disposed exclusively in the patterned device layer between the device and the device anchor.

In certain embodiments of the present invention, the device is spatially separated from the device anchor by a first length and the tether has a second length exclusively in a level with the device that is less than the first length. The tether can have a tether thickness and the second length plus twice the tether thickness can have a range of 0.9 to 1.1, 0.75 to 1.25, or 0.5 to 1.5 times the first length.

In some embodiments, the wafer structure has a minimum patternable feature size and the second length is less than the minimum patternable feature size.

In some embodiments, the native source wafer comprises one or more of a semiconductor, a compound semiconductor, GaAs, a sapphire wafer, a silicon {100} wafer, or a silicon {111} wafer. In some embodiments, the source wafer comprises a wafer material and the patterned sacrificial layer comprises a sacrificial material that is differentially etchable from the wafer material or the source wafer comprises an anisotropically etchable wafer material and the patterned sacrificial layer comprises a designated portion of the anisotropically etchable material.

In some embodiments, the one or more devices are each a light-emitting diode or an integrated circuit.

In some embodiments, the device and the device anchor comprise a common material or the device comprises a substrate material and the device anchor comprises the same substrate material. In some embodiments, the device comprises a material not found in the device anchor or the device comprises a substrate material and the device anchor comprises a material different from the substrate material.

In some embodiments, the device is a micro-transfer printed device disposed on the sacrificial portion and the device comprises or is connected to a fractured or separated tether. The tether can substantially form a right angle with the device anchor in a plane in the patterned device layer and substantially parallel to a surface of the source wafer on which the patterned device layer is disposed.

In some embodiments of the present invention, the wafer structure comprises one or more device substrates, each device substrate is disposed entirely over the corresponding one of the one or more sacrificial portions and under one of the one or more devices and the one of the one or more devices comprises one or more elements disposed on or over each of the device substrates. The elements can be formed on or micro-transfer printed onto the device substrates. The one or more elements can each comprise or be connected to a fractured tether.

In some embodiments, the device layer comprises GaAs, the one or more devices do not extend through the GaAs, and the one or more sacrificial portions comprises a layer of AlGaAs. In some embodiments, the device layer extends beyond the one or more devices over the one or more sacrificial portions. In some embodiments, the source wafer is a GaAs wafer.

In another aspect, the present invention is directed to a method of making a wafer structure that comprises providing a source wafer having a patterned sacrificial layer defining one or more anchor portions separating one or more sacrificial portions, disposing a patterned device layer at least partially on or over the patterned sacrificial layer forming a device anchor on each of the anchor portions, disposing one or more devices in the patterned device layer, each of the one or more devices disposed entirely over a corresponding one of the one or more sacrificial portions and spatially separated from the one or more device anchors and anchor portions, and forming a tether structure connecting each of the one or more devices to the device anchor disposed on one of the one or more anchor portions, the tether structure comprising a tether device portion disposed at least partly on or over the device, a tether anchor portion disposed at least partly on or over the device anchor, and a tether connecting the tether device portion to the tether anchor portion, wherein each tether structure is physically continuous and each tether is disposed at least partly in the patterned device layer between the device and the device anchor. In some embodiments, at least a portion of the tether is disposed exclusively in the patterned device layer between the device and the device anchor.

The step of disposing a device in the patterned device layer can comprise patterning the patterned device layer on at least the one or more sacrificial portions to form the one or more devices. The step of providing a device in the patterned device layer can comprise providing a device substrate over a sacrificial portion of the one or more sacrificial portions and micro-transfer printing an element onto the device substrate.

In some embodiments, a plurality of elements is micro-transfer printed onto the device substrate.

In some embodiments, the one or more sacrificial portions are etched to form a gap between the device and the source substrate.

In some embodiments, the wafer structure has a minimum resolution defined by the minimum patternable feature size and the tether has a length exclusively in a level of the device that is less than that is less than the minimum patternable feature size.

In another aspect, the present invention is directed to a wafer structure comprises a source wafer comprising a patterned sacrificial layer defining one or more anchor portions separating one or more sacrificial portions, a patterned device layer disposed at least partially on or over the patterned sacrificial layer, the patterned device layer comprising a lower layer adjacent to the one or more sacrificial portions and an upper layer disposed on a side of the lower layer opposite the one or more sacrificial portions, one or more devices formed in the upper layer or disposed on the lower layer to form the upper layer of the patterned device layer, each of the one or more devices disposed entirely over a corresponding one of the one or more sacrificial portions and spatially separated from the one or more anchor portions, and a physically continuous tether structure connecting each of the one or more devices to one or more of the one or more anchor portions or structures provided on or over the one or more anchor portions.

In some embodiments, the source wafer comprises GaAs, the one or more sacrificial portions comprises AlGaAs, or the lower layer of the patterned device layer comprises GaAs. The device can comprise the same material as the lower layer. The lower layer can have a greater extent over the source wafer than the upper layer and a greater extent over the source wafer than the device.

In some embodiments of the present invention, a device structure comprises a lower layer comprising a semiconductor material having a lateral extent, a patterned upper layer comprising a semiconductor device disposed entirely on the lower layer, wherein the semiconductor device comprises the semiconductor material and having a lateral extent less than the lower layer, and a physically continuous tether structure comprising a tether device portion at least partly on the device, the upper layer, or the lower layer and a tether adjacent to, optionally in contact with the lower layer, and in a common layer with the lower layer. The semiconductor material can be GaAs and the tether structure can comprise a dielectric.

The structures and methods described herein enable a reliable and repeatable micro-transfer printing process that avoids or reduces particulate generation and/or contamination.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
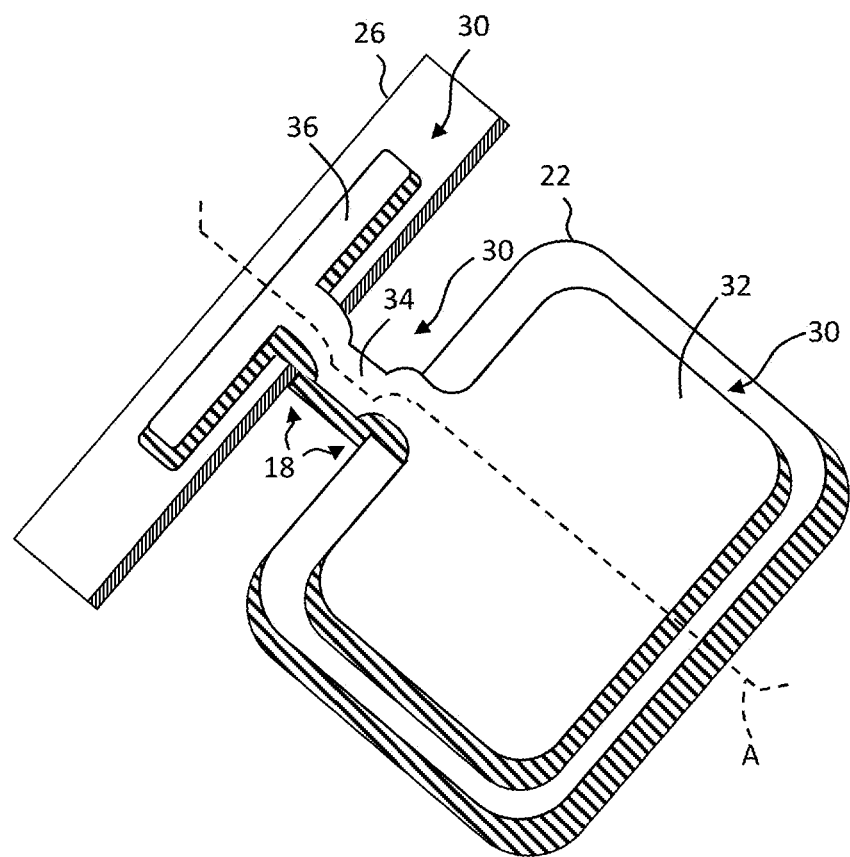
FIG. 1A is a perspective of a tether structure, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present invention provides, inter alia, a structure and method for micro-transfer printing micro-devices from a source wafer using a stamp. In certain embodiments of the present invention, the micro-devices are attached to anchor portions, or structures provided on or over the anchor portions, of the source wafer with tethers (bridge elements). The tethers are structured to fracture at a consistent location in the tether in response to a controlled contact from a stamp without the production of contaminating particles.

Figure 1B:
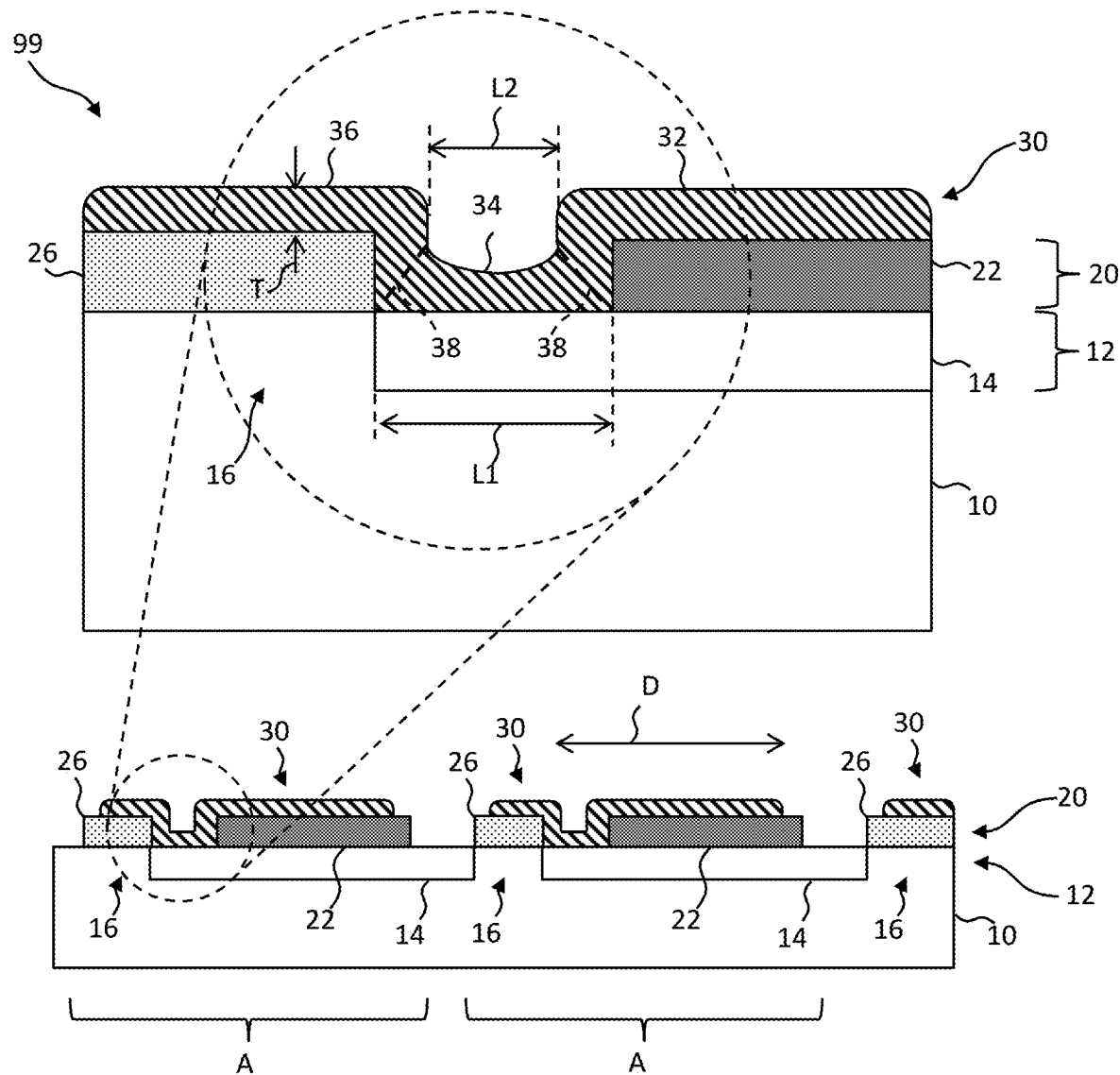
FIG. 1B is a cross-section and enlargement of illustrative embodiments of the present invention corresponding to cross section line A of FIG. 1A.
Figure 1C:
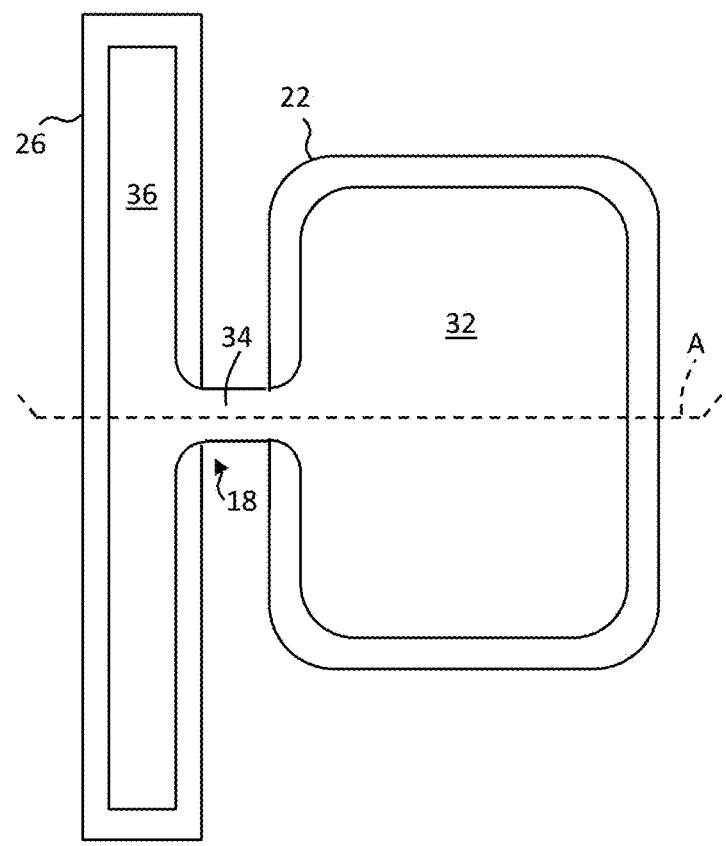
FIG. 1C is a plan view of an illustrative embodiment of the present invention corresponding to FIGS. 1A and 1B and indicating cross section line A.
Figure 1D:
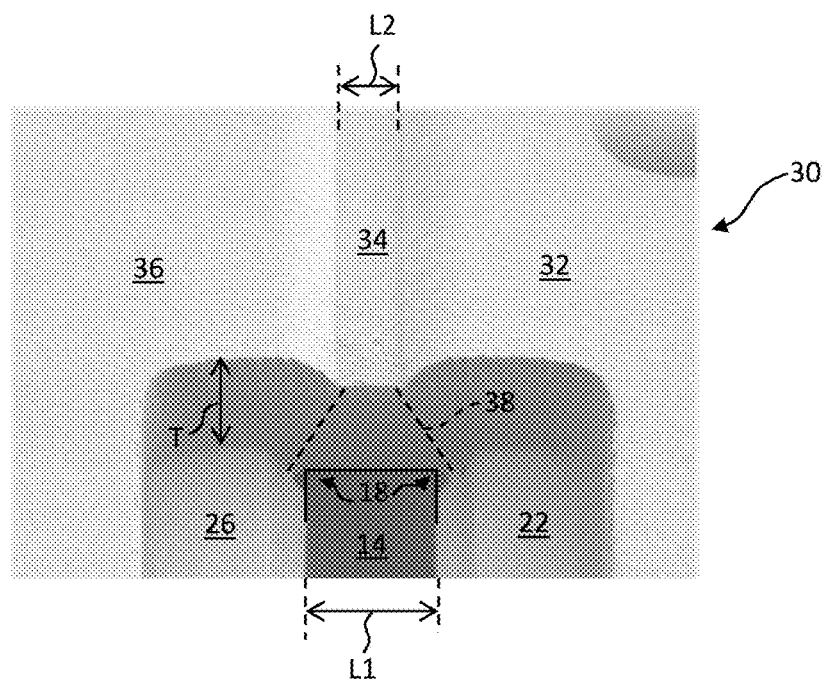
FIG. 1D is a micrograph of a constructed and illustrative embodiment of the present invention corresponding to FIGS. 1A, 1B, and 1C.

Referring to the perspective of FIG. 1A, the cross section and enlargement of FIG. 1B taken across cross section line A of FIG. 1A, the corresponding plan view of 1C, and the micrograph of FIG. 1D, in some embodiments of the present invention, a wafer structure 99 comprises a source wafer 10 comprising a patterned sacrificial layer 12 defining one or more anchor portions 16 separating one or more sacrificial portions 14. The separation between the anchor portions 16 and the sacrificial portions 14 of the patterned sacrificial layer 12 can be in a direction D parallel to an extensive and substantially planar surface of the source wafer 10. Generally, the term 'substantially' used herein refers to structural attributes made within the tolerances and resolutions of the materials and manufacturing processes. FIG. 1B illustrates two of the structures shown in FIGS. 1A, 1C, and 1D.

A patterned device layer 20 can be disposed at least partially on or over the patterned sacrificial layer 12 forming a device anchor 26 on each of the anchor portions 16. In some embodiments, the anchor portion 16 can comprise the device anchor 26. One or more devices 22 are disposed in the patterned device layer 20, each device 22 disposed entirely over a corresponding one of the one or more sacrificial portions 14 and spatially separated from the one or more device anchors 26 or anchor portions 16, for example separated in the direction D. A tether structure 30 connects each device 22 to a device anchor 26 or anchor portion 16. The tether structure 30 comprises a tether device portion 32 disposed at least partly on or over the device 22, a tether anchor portion 36 disposed at least partly on or over the device anchor 26 or anchor portion 16, and a tether 34 connecting the tether device portion 32 to the tether anchor portion 36. Each tether structure 30 is physically continuous. Each tether 34 is disposed at least partly in the patterned device layer 20 between the device 22 and the device anchor 26, for example in the direction D. In some embodiments, at least a portion of the tether 34 is disposed exclusively in the patterned device layer 20 between the device and the device anchor 26 in the direction D.

The tether structure 30 is a multi-level or multi-layer structure because it extends into at least two layers or levels in the wafer structure 99, for example in the patterned device layer 20 and on or over (above) the patterned device layer 20.

In certain embodiments, the source wafer 10 can be any structure with a surface suitable for forming patterned sacrificial layers 12 and the patterned device layer 20. For example, source wafers 10 can comprise wafers of glass, plastic, metal, ceramic, sapphire, semiconductor, or compound semiconductor materials. The semiconductor materials can be silicon or silicon with a {111} or {100} crystal structure (e.g., orientation), and the compound semiconductor can be GaAs or GaN, but are not limited to these materials. The wafer surface can be substantially planar and suitable for photolithographic processing, for example as found in the integrated circuit or printed circuit board art.

A patterned sacrificial layer 12 can comprise a layer of material different from that of the source wafer 10 or can comprise a designated portion of the source wafer 10 and include essentially the same material. For example, in some embodiments, the source wafer 10 is a semiconductor wafer and the patterned sacrificial layer 12 comprises a dielectric such as an oxide (e.g., silicon dioxide) or nitride (e.g., silicon nitride). The patterned sacrificial layer 12 can comprise different materials, for example an anchor portion 16 can be the same material as the source wafer 10 (e.g., a semiconductor material) and the sacrificial portion 14 can be a dielectric material, for example a dielectric material disposed in a cavity corresponding to the sacrificial portions 14 etched into the patterned sacrificial layer 12. In some embodiments, a patterned sacrificial layer 12 is a designated layer or portion of a source wafer 10 and the anchor and sacrificial portions 16, 14 of are likewise designated portions of the patterned sacrificial layer 12. The anchor and sacrificial portions 16, 14 can be distinguished by their defined locations or with reference to a crystalline structure of the source wafer 10, for example a silicon {111} or {100} wafer and crystal structure.

In some embodiments of the present invention, sacrificial portions 14 are sacrificed, for example by etching, to form an empty gap G (e.g., not filled with solid or liquid material but possible including a vacuum or filled with a gas such as air, nitrogen, oxygen, or other gases, see FIGS. 6G, 7, and 8, discussed further below). Thus, in some embodiments, the sacrificial portions 14 can comprise a material that is differentially etchable from the source wafer 10 and the anchor portions 16. In some embodiments, the source wafer 10 material has a crystalline structure (e.g., silicon {111} or {100}) that is anisotropically etchable so that the patterned sacrificial layer 12 can be etched to form an empty sacrificial portion 14 (gap G) but not etch the anchor portions 16.

The patterned device layer 20 can comprise a layer of material such as a semiconductor or compound semiconductor material (e.g., silicon, GaAs, GaN, or other semiconductor or compound semiconductor materials) or dielectric materials. The patterned device layer 20 material can be the same material as the source wafer 10 or a different material. In some embodiments, the devices 22 are formed in or have a substrate material that is the patterned device layer 20 material, for example by photolithographic processing, and the device anchor 26 comprises the same substrate material and is separated in the direction D from the devices 22. In such embodiments, the patterned device layer 20 material can be the same material as the source wafer 10, for example a semiconductor material or a semiconductor material such as silicon or GaN disposed on an insulator such as glass, sapphire, or quartz, or other epitaxial materials.

In some embodiments, device anchors 26 are formed by photolithographic processing but devices 22 are disposed on or over sacrificial portions 14 by placement, for example by micro-transfer printing the devices 22 onto the sacrificial portions 14. In such embodiments, a patterned device layer 20 material or the device anchor 26 can comprise a different material than the source wafer 10 or the device 22 substrate material, for example a dielectric material. The devices 22 can be, for example, integrated circuits, control circuits, light emitting diodes (LEDs), photo-sensors, digital circuits, analog circuits, mixed signal circuits, or other devices known in the integrated circuit arts. Thus, the devices 22 can be micro-transfer printed devices 22 disposed on the sacrificial portions 14 and the devices 22 can comprise a fractured or separated tether 34.

In some embodiments of the present invention, the physically continuous tether structure 30 can comprise any of a variety of materials. In certain embodiments, a tether structure 30 is a unitary structure with different portions disposed on different parts of a wafer structure 99. A tether structure 30 can comprise or be a dielectric, for example a nitride, an oxide, silicon nitride, silicon oxide, silicon dioxide, silicon oxynitride, aluminum oxide, aluminum nitride, dielectrics deposited by chemical vapor deposition (CVD), or thermally grown oxides or nitrides, such as silicon oxide. In some embodiments, a tether structure 30 is a polymer, for example including but not limited to photoresist, polyimide, epoxy, or resin. In some embodiments, the tether structure 30 can be a metal, for example a noble metal. Tether structure 30 materials can be deposited and patterned by photolithographic processes, for example evaporation and sputtering and, in some embodiments, together with curing, etching, and stripping of pattern-wise exposed mask layers. A tether structure 30 material can be the same or similar material as the device anchor 26 or can be a different material.

A tether device portion 32 of a tether structure 30 can be an encapsulating or protective layer. The tether device portion 32 can include vias 54 to enable electrical connection to contact pads 50 on the device 22 (not shown in FIGS. 1A-1D but discussed below with respect to FIGS. 9 and 10).

According to some embodiments of the present invention, a tether structure 30 has a non-planar topography. Portions of the tether 34 of the tether structure 30 are closer to the source wafer 10 than the tether device portion 32 or the tether anchor portion 36 in a vertical direction orthogonal to a horizontal plane substantially parallel to a surface of the source wafer 10 on which the patterned device layer 20 is disposed. Vertical edges of the tether 34 can have a substantially ninety-degree angle 18 with respect to the device anchors 26 and devices 22 in the horizontal plane in the patterned device layer 20 (so that the vertical edges of the tether 34 and the vertical edges of the device portion 26 (or the vertical edges of the device 22) form a right angle in the horizontal plane). Because the tether structures 30 are non-planar and can have side walls in contact with the devices 22 and the device anchors 26 at a substantially ninety-degree angle 18, in certain embodiments, when a micro-transfer printing stamp contacts the devices 22 to remove them, the tethers 34 fracture in a very predictable way along fracture lines 38 under a consistent stamp force and generates very few, if any, contaminating particles. Fewer particles, in turn, improve the yield of a micro-transfer print process.

FIG. 1A is a perspective and FIG. 1C is a plan view illustrating a tether structure 30 with a tether device portion 32 disposed on a portion of a device 22, a tether anchor portion 36 disposed on a portion of a device anchor 26, and a tether 34 connecting the tether device portion 32 and the tether anchor portion 36 and connecting the device anchor 26 to the device 22. For clarity, the source wafer 10 is not shown in FIG. 1A. FIG. 1B illustrates a cross section of the wafer structure 99 along cross section line A of FIGS. 1A and 1C, with the source wafer 10, patterned sacrificial layer 12, patterned device layer 20, and tether structure 30. FIG. 1D is a micro-graph of a constructed tether structure 30 according to some embodiments of the present invention, showing a tether 34, tether device portion 32, tether anchor portion 36 and underlying device anchor 26, device 22, and sacrificial portion 14. Fracture lines 38 are indicated. The tether 34 has an edge wall at a ninety-degree angle 18 to the edge walls of the underlying device anchor 26 and device 22 in a plane in the patterned device layer 20 and substantially parallel to a surface of the source wafer 10 on which the patterned device layer 20 is disposed and, when fractured, demonstrates superior performance and reduced contamination.

Referring to FIGS. 1B and 1D, the tether 34 has a second length L2 within the patterned device layer 20 that is less than the spatial separation between the device anchor 26 and device 22 in the direction D, first length L1, because the tether 34 has a physical thickness T. Thus, in certain embodiments of the present invention, the device 22 is spatially separated from the device anchor 26 (or the anchor portion 16) by a first length L1, the tether 34 has a tether thickness T, and the tether 34 has a second length L2 exclusively in the device level that is less than the first length L1. The difference between the first and second lengths L1 and L2 can be, but is not necessarily the thickness T or twice the thickness T, since the thickness T of the tether structure 30 can vary at different locations within the tether structure 30. The thickness of T and the relative difference between the first and second lengths L1 and L2 can be controlled to control the fracturing characteristics of the tether 34, for example depending on the materials or relative sizes of the tether 34, device anchor 26, the device 22, the anchor portion 16, or the sacrificial portion 14. According to some embodiments of the present invention, the second length L2 plus twice the tether thickness T is substantially equal to the first length L1 or is within a range of 0.9 to 1.1, 0.75 to 1.25, or 0.5 to 1.5 times the first length L1. Furthermore, because the tether 34 second length L2 does not have to be separately patterned (but can be formed as a result of patterning the entire tether structure 30) the second length L2 can be smaller than the minimum patternable feature size of the wafer structure 99. For example, the minimum patternable feature size can be the first length L1 that separates the device anchor 26 from the device 22, or the distance between the sacrificial portions 14 and the anchor portions 16 of the patterned sacrificial layer 12 (that can also be the first length L1). Such a small tether 34 can enable a denser arrangement of devices 22 and device anchors 26 (corresponding to the density of the anchor portions 16 and sacrificial portions 14) on the source wafer 10, providing improved utilization of the source wafer 10 area and reduced costs.

Figure 2A:
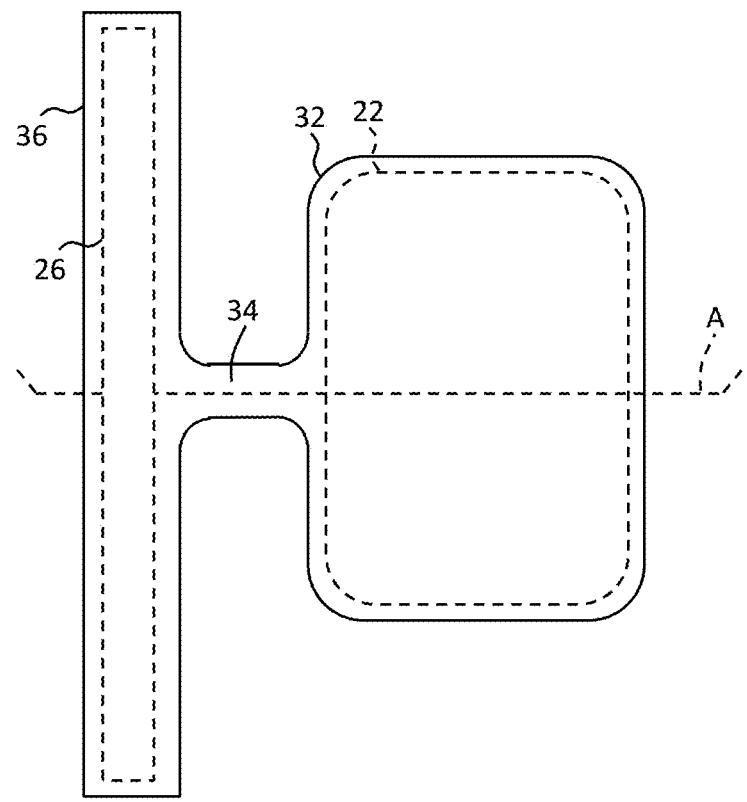
FIG. 2A is a plan view of a wafer structure, according to illustrative embodiments of the present invention.
Figure 9:
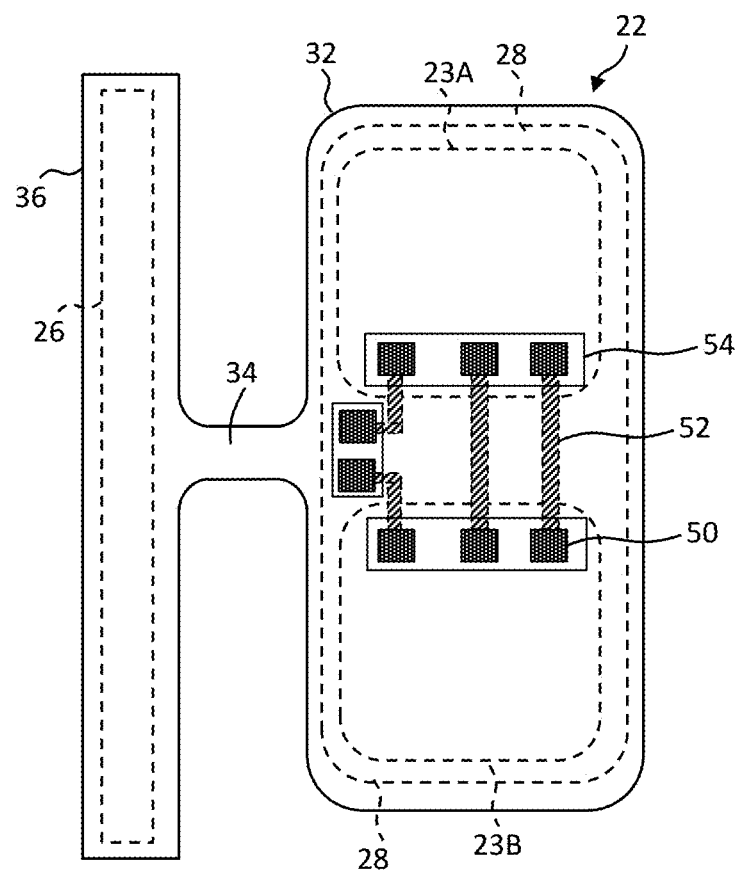
FIGS. 9-10 are plan views of compound structures, according to illustrative embodiments of the present invention.
Figure 10:
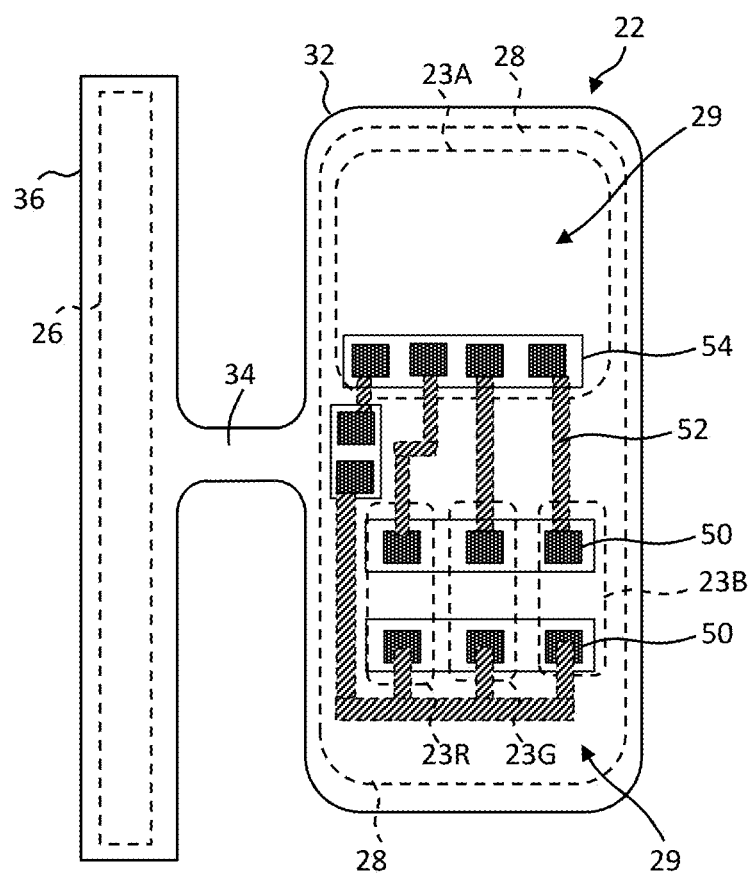

Referring to FIG. 1C, the tether device portion 32 of the tether structure 30 covers a portion, but not all of, the device 22. Similarly, the tether anchor portion 36 covers only a portion of the device anchor 26. Referring to the plan view of FIG. 2A and the cross section of FIG. 2B taken across the cross section line A of FIG. 2A, in some embodiments of the present invention, the tether device portion 32 of the tether structure 30 covers all of the device 22, thereby encapsulating the upper portion of the device 22 and protecting it from the environment. In some embodiments, vias 54 are formed in the tether device portion 32 to enable electrical access to device 22 contact pads 50 but the device 22 is otherwise completely encapsulated by the tether device portion 32 (e.g., as shown in FIGS. 9 and 10, discussed below). Likewise, a device anchor 26 can be encapsulated by a tether anchor portion 36 (e.g., as shown in FIG. 2A). In some embodiments, one or the other, but not both, of a device anchor 26 and device 22 is substantially encapsulated by a tether structure 30, aside from vias 54.

Figure 3:
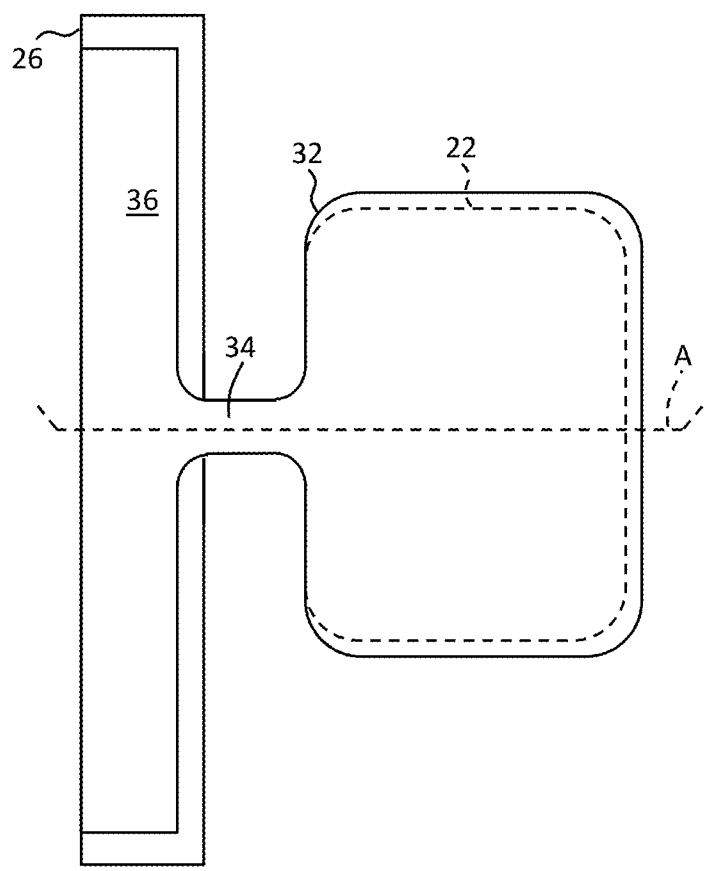
FIGS. 3 and 4 are plan views of wafer structures, according to illustrative embodiments of the present invention.
Figure 4:
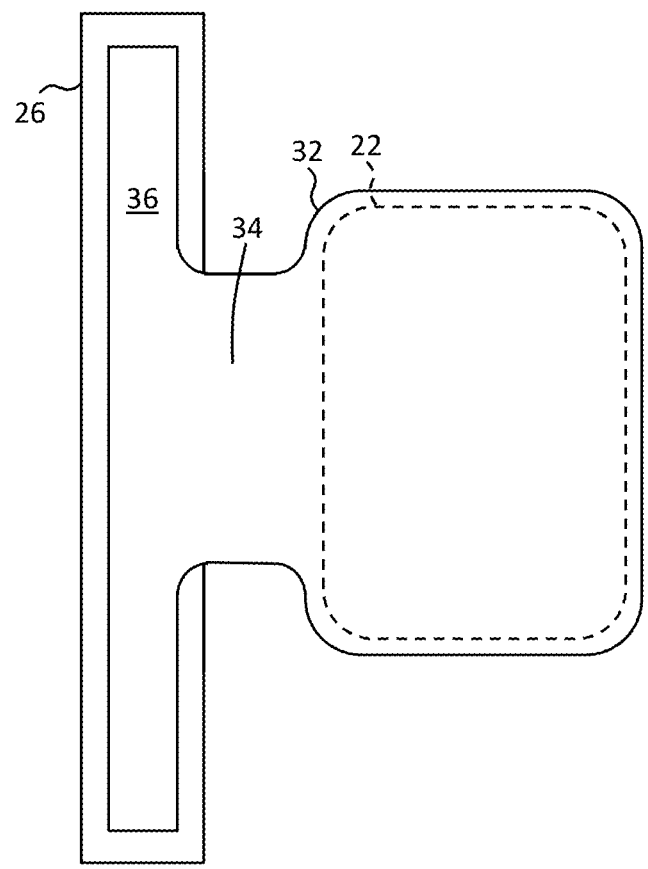

Referring to FIG. 3, in some embodiments one side of a device anchor 26 and three sides of a device 22 are encapsulated by a tether structure 30. In embodiments according to the exemplary embodiment illustrated in FIG. 4, the width of the tether 34 is enlarged, for example having a width that is more than half of the side of the device 22 parallel to the device anchor 26.

Figure 5A:
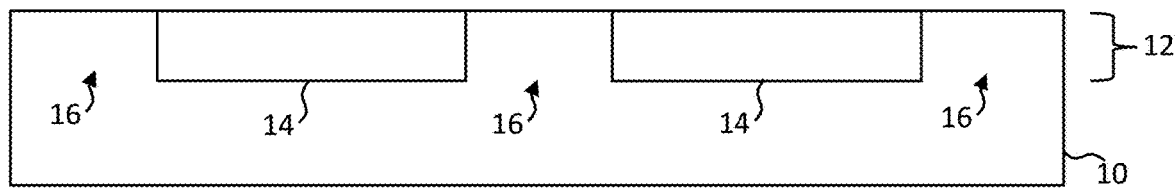
FIGS. 5A-5F are sequential cross sections illustrating steps of an illustrative method, according to illustrative embodiments of the present invention.
Figure 5B:
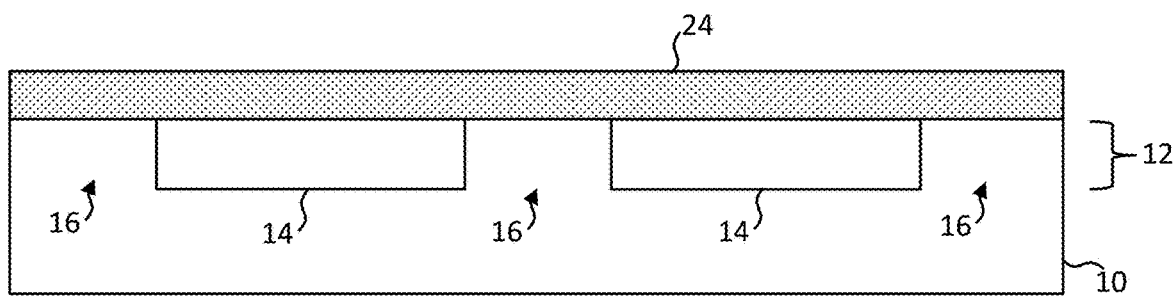
Figure 5C:
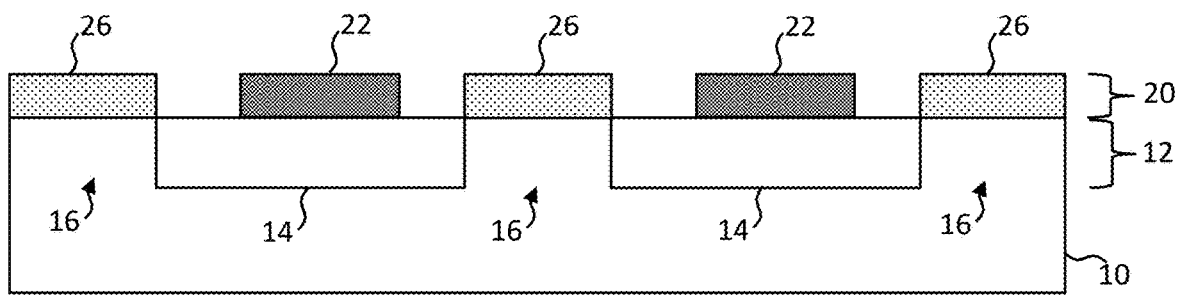
Figure 12:
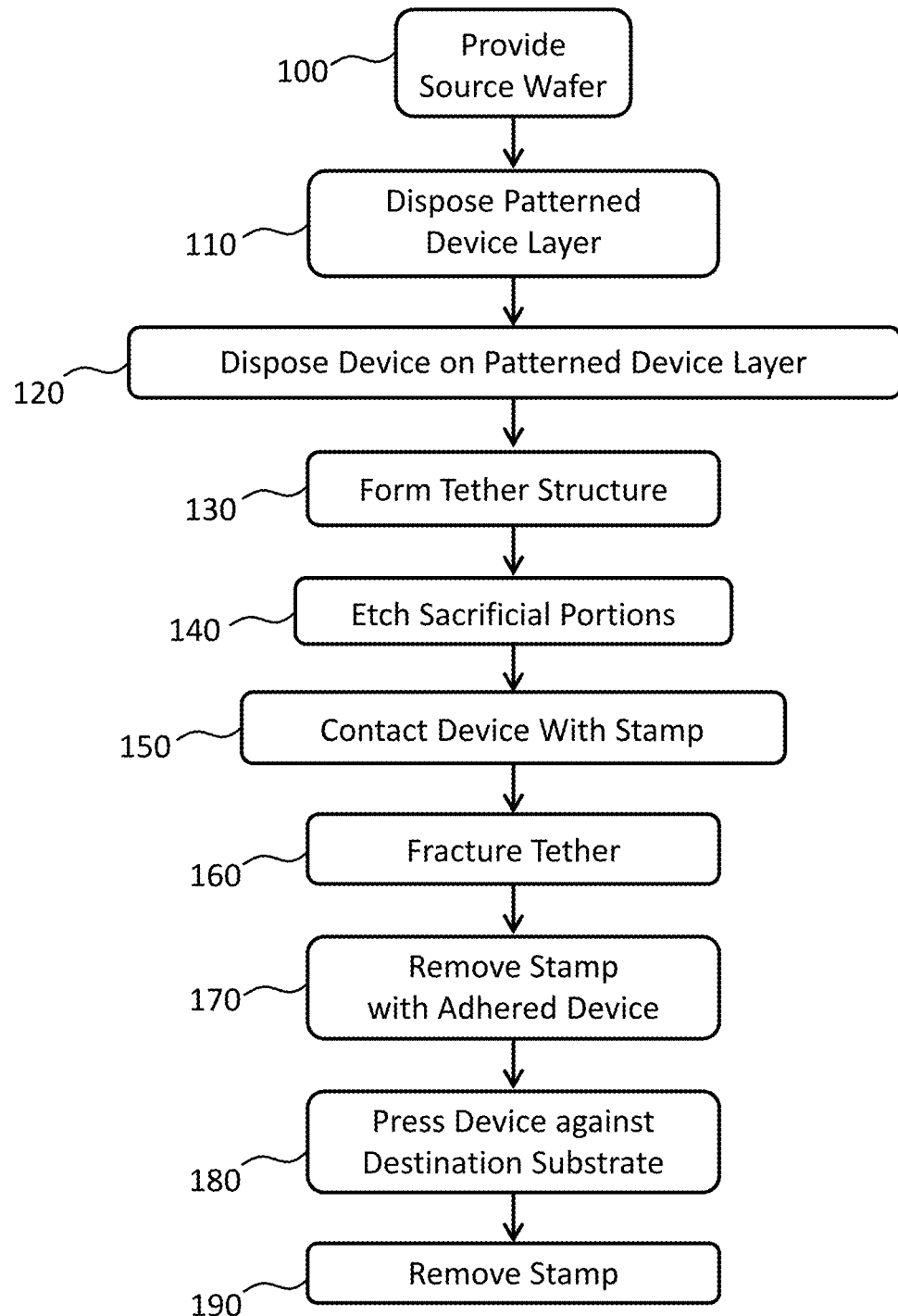
FIG. 12 is a flow diagram of an illustrative method, according to illustrative embodiments of the present invention.

Referring to the sequential structures of FIGS. 5A-5F and the flow diagram of FIG. 12, a method of making a wafer structure 99 comprises providing a source wafer 10 having a patterned sacrificial layer 12 defining one or more anchor portions 16 separating one or more sacrificial portions 14 in step 100 (FIG. 5A). In step 110 and as shown in FIGS. 5B and 5C, a device layer 24 of material is disposed on the patterned sacrificial layer 12 and patterned to form patterned device layer 20 that is at least partially on or over the patterned sacrificial layer 12. The patterned device layer 20 provides a device anchor 26 on each of the anchor portions 16. As shown in FIG. 5C, in step 120 one or more devices 22 are disposed in the patterned device layer 20, each device 22 disposed entirely over a corresponding one of the one or more sacrificial portions 14 and spatially separated from the one or more device anchors 26.

Figure 2B:
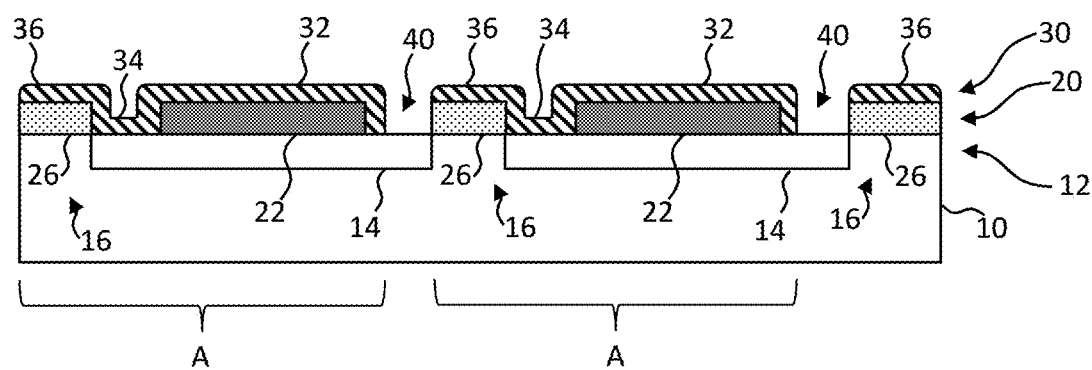
FIG. 2B is a cross-section of an illustrative embodiment of the present invention corresponding to cross section line A of FIG. 2A.
Figure 5D:
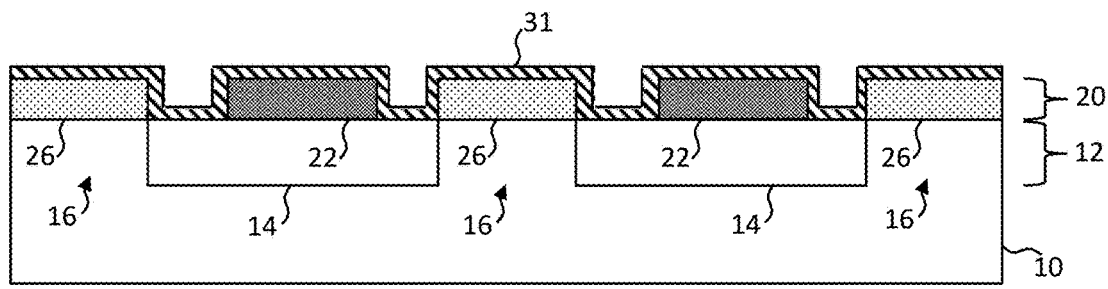
Figure 5E:
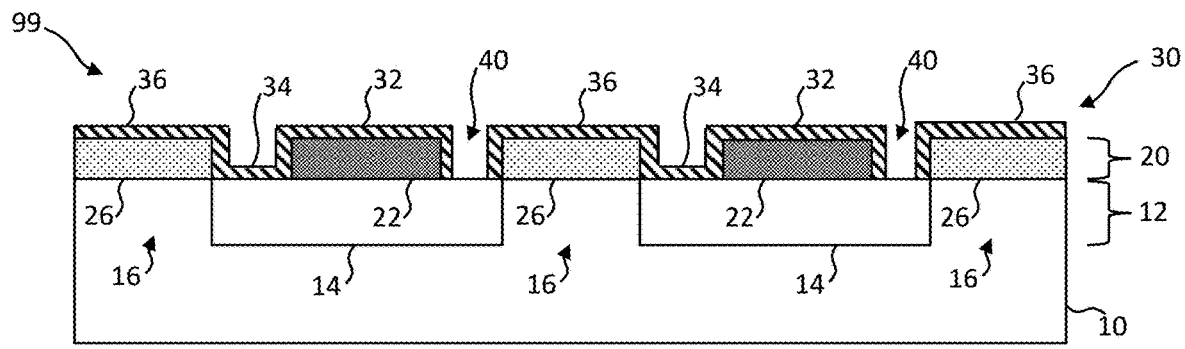
Figure 5F:
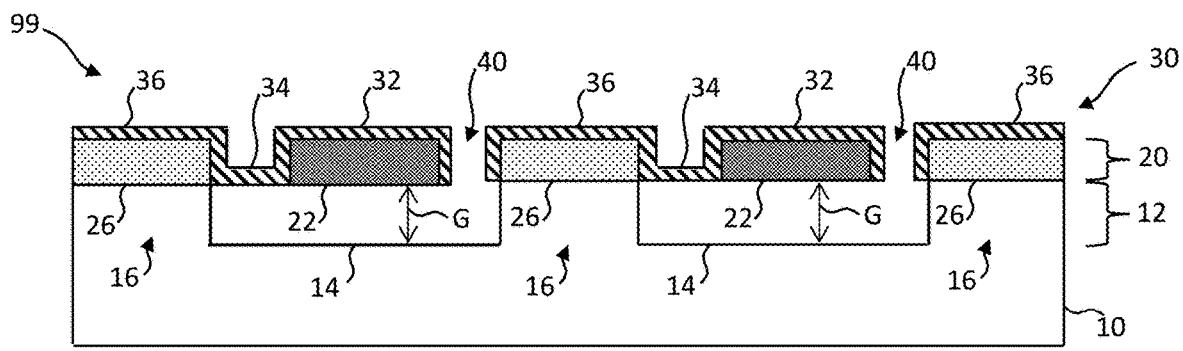

In step 130 and as shown in FIG. 5D, tether material 31 (for example a dielectric) is disposed on the devices 22, sacrificial portion 14, and the device anchor 26 and then patterned to form a tether structure 30 having separate and independent tethers 34 connecting each device 22 to a device anchor 26, for example as shown in FIGS. 2A and 2B, using photolithographic materials and methods. The tether structure 30 comprises a tether device portion 32 disposed at least partly on or over the device 22, a tether anchor portion 36 disposed at least partly on or over the device anchor 26, and a tether 34 connecting the tether device portion 32 to the tether anchor portion 36. Each tether structure 30 is physically continuous. Each tether 34 is disposed at least partly in the patterned device layer 20 between the device 22 and the device anchor 26. As further shown in FIG. 5E, the tether structure 30 can be patterned to form openings 40 in the tether structure 30 over the sacrificial portions 14 to allow etchants to attack and dissolve the sacrificial portions 14 in step 140 and form gaps G between the devices 22 and the source wafer 10 (FIG. 5F).

In step 150, a micro-transfer printing stamp can contact the device 22, pressing against the device 22 and then lifting away from the source wafer 10 to fracture the tether 34 (step 160) and adhere the device 22 to the stamp. The stamp is removed (step 170) to a destination substrate and the device 22 is pressed against the destination substrate in step 180, to adhere the devices 22 to the destination substrate. The stamp is then removed (step 190) to micro-transfer print the devices 22 from the source wafer 10 to the destination substrate.

Figure 13A:
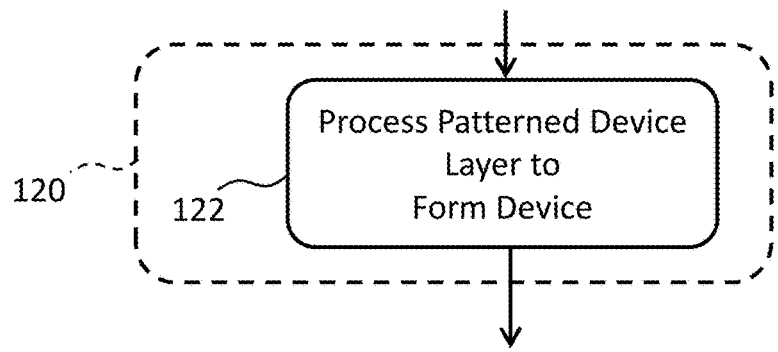
FIGS. 13A, 13B, and 14 are flow diagrams of illustrative methods, according to illustrative embodiments of the present invention.
Figure 13B:
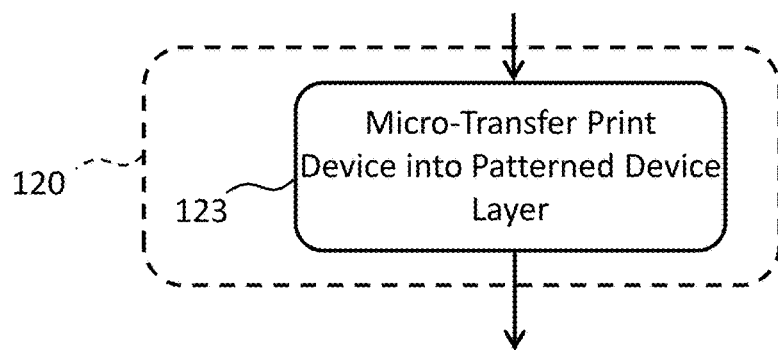

In some embodiments of the present invention, a device 22 is formed in a patterned device layer 20, e.g., as shown in the step 122 of FIG. 13A, by patterning the device layer materials, for example using photolithography. In some embodiments of the present invention, a device 22 is disposed in a patterned device layer 20, e.g., as shown in step 123 of FIG. 13B, by micro-transfer printing the device 22 in or on the patterned device layer 20.

Referring to FIGS. 6A-6G, 9, 10, 12, and 14, in some embodiments of the present invention, a wafer structure 99 comprises one or more device substrates 28. Each device substrate 28 is disposed entirely over a corresponding one of the one or more sacrificial portions 14. One or more components 23 are disposed on or over each of the device substrates 28. The device substrate 28 provides a surface on which the one or more elements 23 can be integrated and photolithographically connected to form a compound micro-transfer printable device 22. The one or more elements 23 can themselves be micro-transfer printed onto the device substrate 28 and can therefore each comprise a fractured tether 34.

Figure 6A:
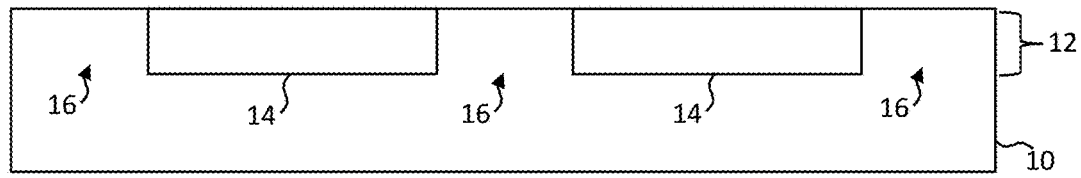
FIGS. 6A-6G are sequential cross sections illustrating steps of another illustrative method, according to illustrative embodiments of the present invention.
Figure 6B:
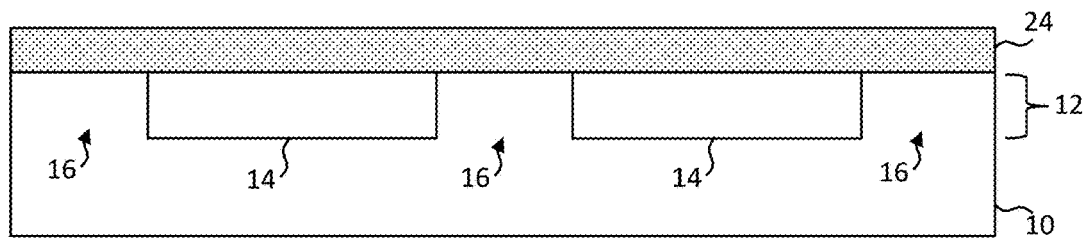
Figure 6C:
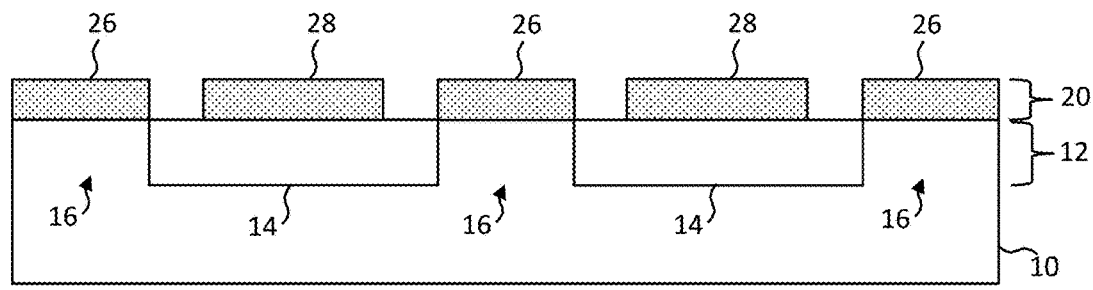
Figure 6D:
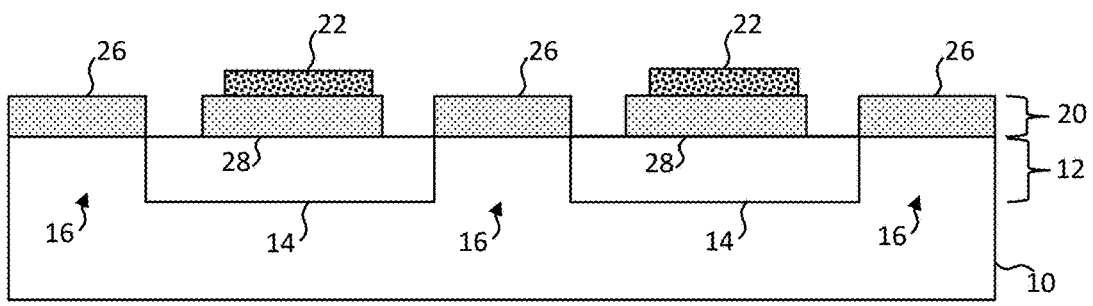
Figure 6E:
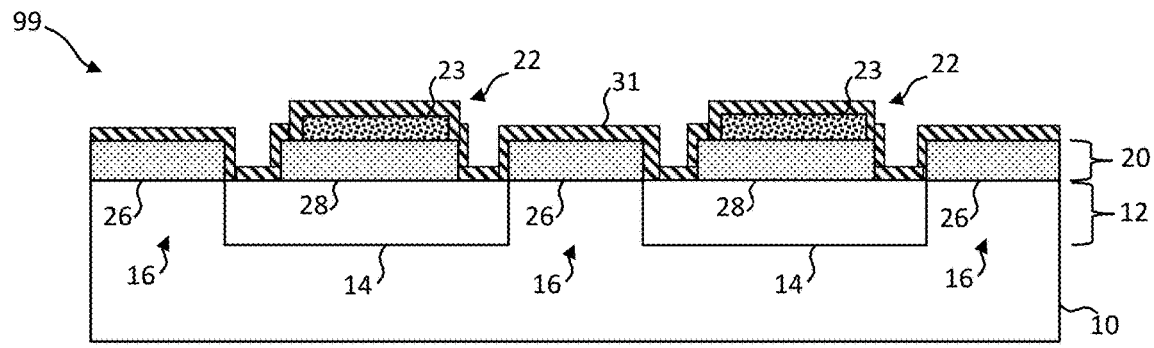
Figure 6F:
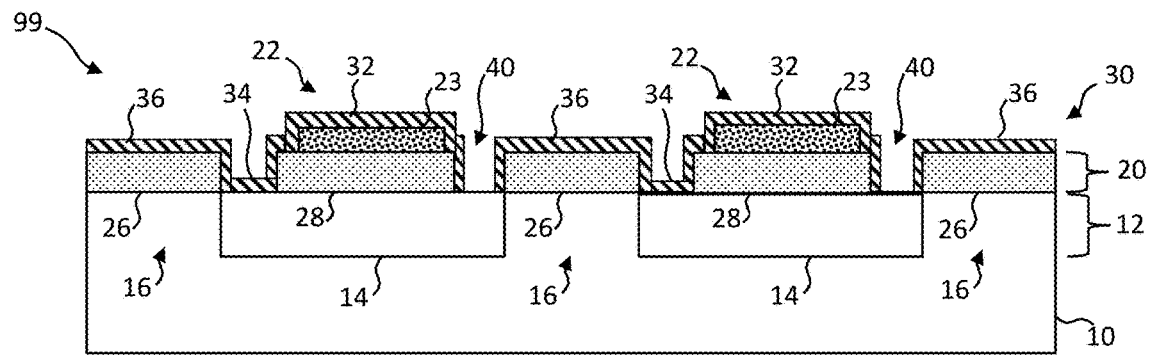
Figure 6G:
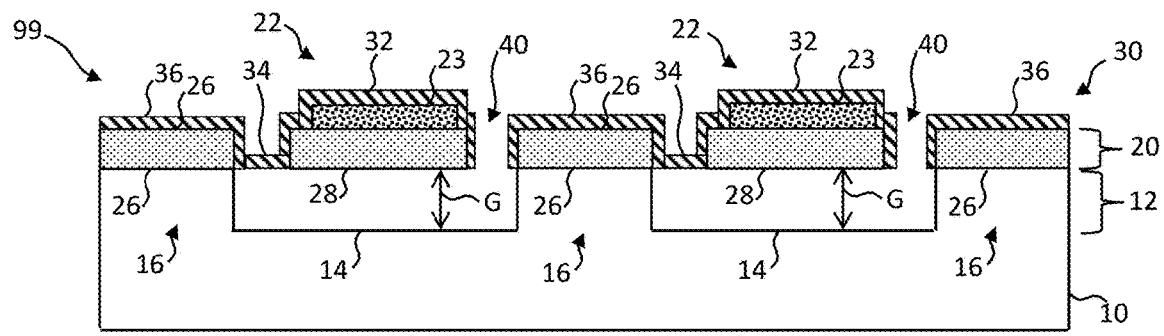
Figure 14:
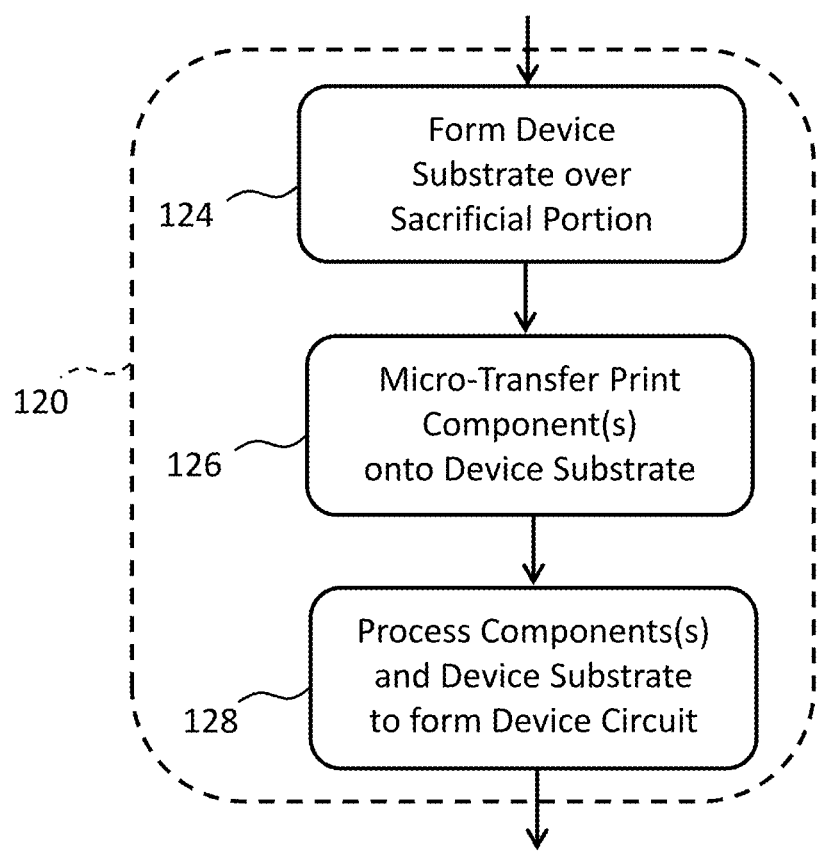

According to methods in certain embodiments of the present invention, and as illustrated in FIGS. 6A-6G, 9, 10, 12, and 14, in step 100 a source wafer 10 is provided having a patterned sacrificial layer 12 defining one or more anchor portions 16 separating one or more sacrificial portions 14 (FIG. 6A, also FIG. 5A). In step 110, a device layer 24 of material is disposed on the patterned sacrificial layer 12 (FIG. 6B and also FIG. 5B) and patterned to form the patterned device layer 20, including the device anchor 26 (FIG. 6C). Referring also to FIG. 14, in some embodiments, the portion of the patterned device layer 20 directly on the sacrificial portions 14 is patterned to provide a device substrate 28 (step 124). The device substrate 28 can be the same material as the device anchor 26, for example a dielectric such as silicon dioxide or silicon nitride, deposited and patterned using photolithographic methods and materials, for example in a common step. As shown in FIG. 6D, in step 126 one or more components 23 (e.g., integrated circuits, control circuits, light emitting diodes (LEDs), photo-sensors, digital circuits, analog circuits, mixed signal circuits, or other components known in the integrated circuit arts) are micro-transfer printed onto the device substrate 28 as part of the patterned device layer 20. In step 128, the one or more components 23 are photolithographically processed to provide contact pads 50 and electrical connections (wires 52) that form a circuit incorporating the one or more components 23.

In step 130 and as shown in FIG. 6E (corresponding to FIG. 5D), tether material 31 is disposed on the devices 22, sacrificial portion 14, and the device anchor 26 and then patterned to form a tether structure 30 having a separate and independent tether 34 connecting each device 22 to a device anchor 26, for example as shown in FIGS. 2A and 2B. The tether structure 30 comprises a tether device portion 32 disposed at least partly on or over the device 22, a tether anchor portion 36 disposed at least partly on or over the device anchor 26, and a tether 34 connecting the tether device portion 32 to the tether anchor portion 36. Each tether structure 30 is physically continuous. Each tether 34 is disposed at least partly in the patterned device layer 20 between the device 22 and the device anchor 26 As further shown in FIG. 6F (corresponding to FIG. 5E), the tether structure 30 can be patterned to form openings 40 in the tether structure 30 over the sacrificial portions 14 to allow etchants to attack and dissolve the sacrificial portions 14 in step 140 and form gaps G between the devices 22 and the source wafer 10 (FIG. 6G corresponding to FIG. 5F). The steps 150-190 can then be performed for the structure of FIG. 6G as for that of FIG. 5F and as described above.

Figure 7:
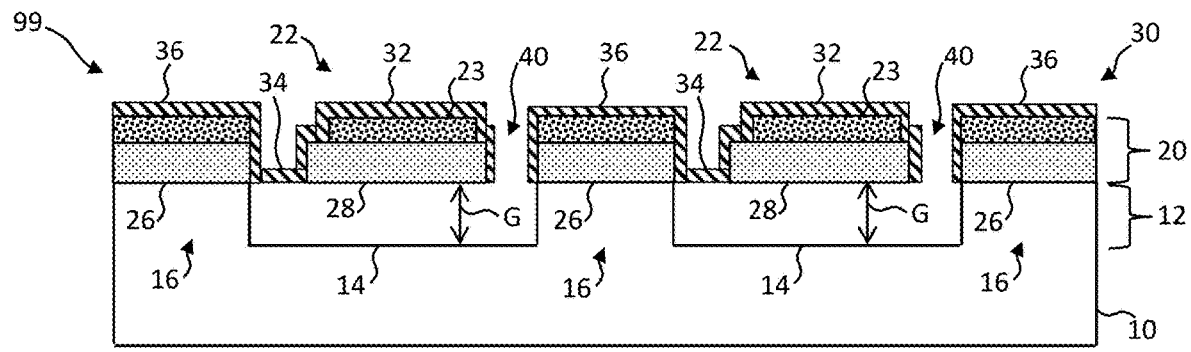
FIGS. 7-8 are cross sections of wafer structures, according to illustrative embodiments of the present invention.
Figure 8:
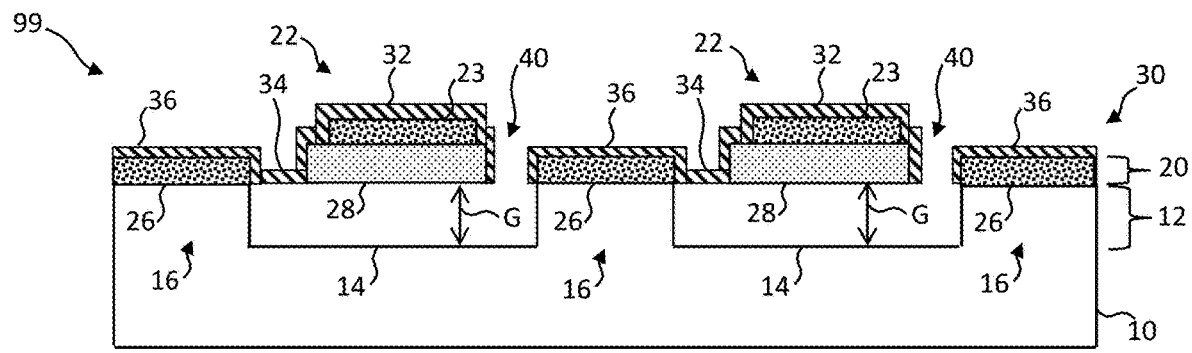

FIGS. 7 and 8 are cross sections illustrating some embodiments of a wafer structure 99, in which components 23 are not micro-transfer printed but are, instead, formed in a patterned device layer 20 using photolithographic materials and processes. In FIG. 7, a portion of the patterned device layer 20 is disposed on the device anchor 26 and encapsulated with it by the tether anchor portion 36 of the tether structure 30. In this illustrative embodiment, for example, the device anchor 26 can comprise the same material as the device substrate 28, for example a dielectric, and the portion of the patterned device layer 20 disposed on the device anchor 26 can be or comprise the same material as the components 23, for example a semiconductor. In FIG. 8, the device substrate 28 material is not present in the device anchor 26 (for example removed photolithographically when the device substrate 28 is formed). Instead, the material used in the components 23 (e.g., a semiconductor) is disposed on the anchor portion 16 to form the device anchor 26 in the patterned device layer 20. Thus, a device anchor 26 can comprise material found in a device substrate 28 or material found in elements 23 (for example a substrate of a component 23), or both.

FIGS. 9 and 10 are plan views of certain embodiments of the present invention. FIG. 9 illustrates a wafer structure 99 having a device 22. The device 22 comprises a device substrate 28 and two micro-transfer printed components, 23A and 23B. The micro-transfer printed components 23A and 23B have contact pads 50 that are exposed through vias 54 in the tether device portion 32 of the tether structure 30 and provide electrical contact to circuits in the components 23A and 23B. The contact pads 50 are electrically connected with wires 52 photolithographically formed on the device substrate 28 and components 23A and 23B. FIG. 10 illustrates a wafer structure 99, according to certain embodiments, incorporating a control circuit (component 23A) controlling three LEDs (components 23R 23G, 23B that emit red, green, and blue light, respectively).

Figure 11:
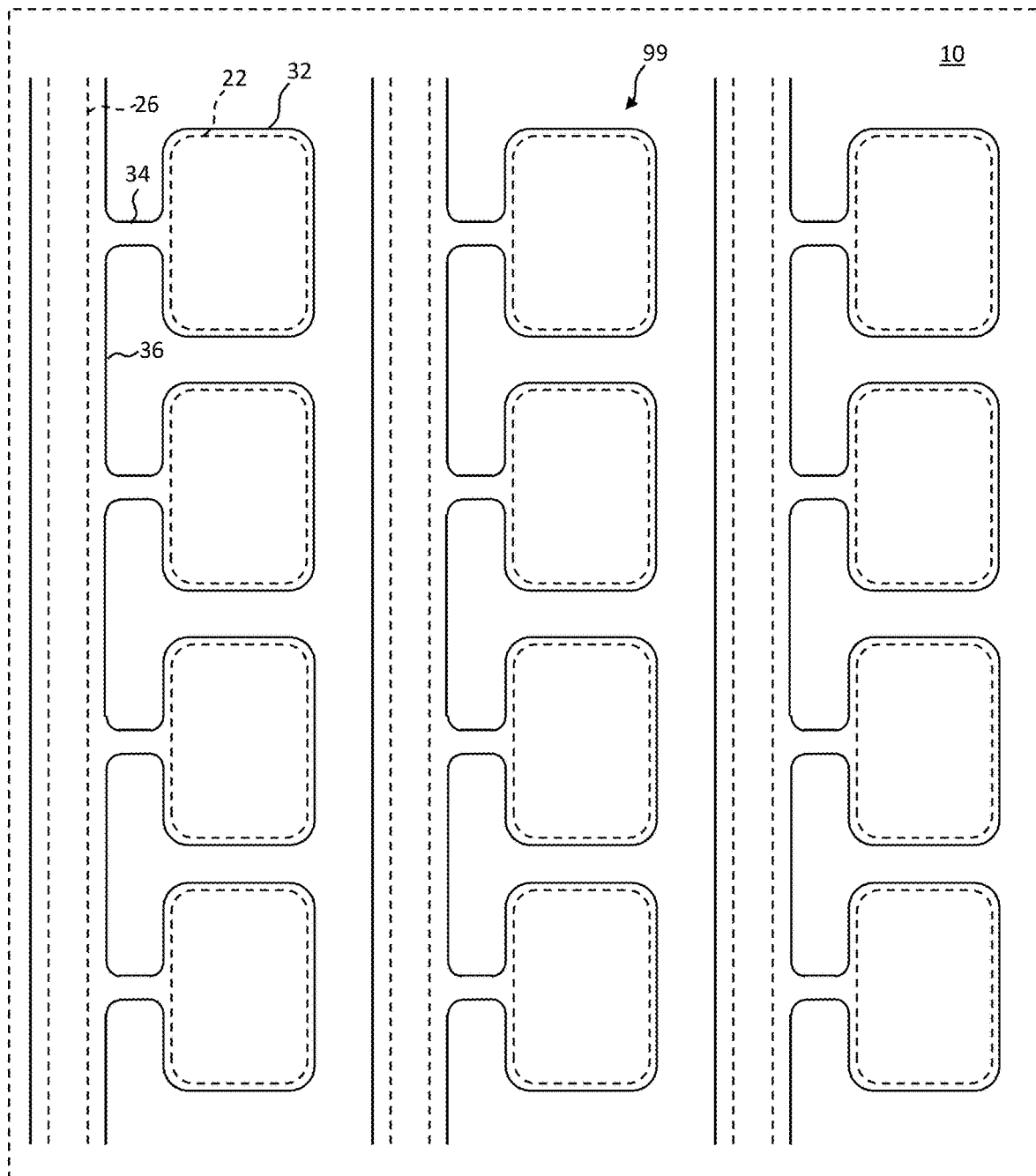
FIG. 11 is a plan view of a source wafer having a plurality of wafer structures, according to illustrative embodiments of the present invention.

FIG. 11 is a large-scale plan view of a source wafer 10 incorporating a plurality of wafer structures 99 arranged in an array on the source wafer 10. The device anchors 26 in each column of wafer structures 99 are joined as are the tether anchor portions 36 of the tether structures 30 into contiguous structures.

In certain embodiments, sacrificial portions 14 are differentially etchable from devices 22 and a source wafer 10, either because the material of the sacrificial portions 14 is different from the material of the source wafer 10 or because the material of the source wafer 10 is anisotropically etchable so that a designated portion of the source wafer 10 (the sacrificial portions 14) can be etched. A variety of material types can be used for the source wafer 10 and the sacrificial portions 14. However, some combinations of materials can encounter processing difficulties, for example due to material oxidation. For example, the surface of sacrificial portions 14 can oxidize and form particles that interfere with the processing and construction or deposition of devices 22 over or on the sacrificial portions 14.

Figure 15:
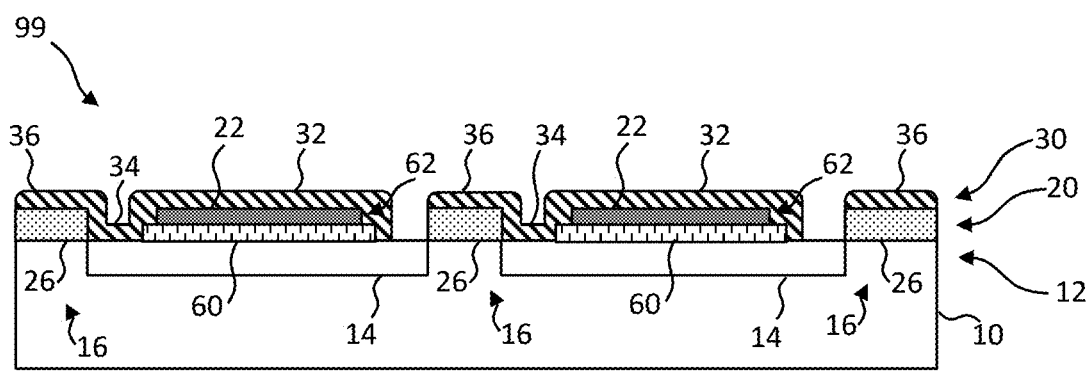
FIGS. 15-17 are cross sections of wafer structures, according to illustrative embodiments of the present invention.

Referring to the cross section of FIG. 15, in certain embodiments of the present invention, a portion of a patterned device layer 20 disposed over sacrificial portions 14 incorporates multiple material layers, for example a lower layer 60 adjacent to the one or more sacrificial portions 14 and an upper layer 62 on a side of the lower layer 60 opposite the one or more sacrificial portions 14. In some embodiments, a device 22 is formed in an upper layer 62, for example a semiconductor layer; in some embodiments, a device 22 is disposed on a lower layer 60 to form an upper layer 62, for example by micro-transfer printing. In either case, the device 22 is disposed entirely over a corresponding one of the one or more sacrificial portions 14 and is spatially separated from the one or more device anchors 26 or anchor portions 16. In some embodiments, a lower layer 60 extends over more of a sacrificial portion 14 than an upper layer 62 or a device 22.

A lower layer 60 can serve as an etch protectant (e.g., etch-stop layer) to a device 22 when a sacrificial portion 14 is etched. Furthermore, a lower layer 60 can serve as a protective encapsulation layer for the material of a sacrificial portion 14, for example to prevent oxidation during photolithographic processing steps performed on, or to construct, a device 22 or tether structure 30. Although edges of sacrificial portions 14 can be exposed to processing materials, for example, that could oxidize the edges of the sacrificial portion 14 material, the exposure is sufficiently limited that it does not interfere with the construction or disposition of the device 22 (or components 23) in the patterned device layer 20. A lower layer 60 and device 22 or upper layer 2 can comprise the same material or be the same material as the source wafer 10.

Figure 16:
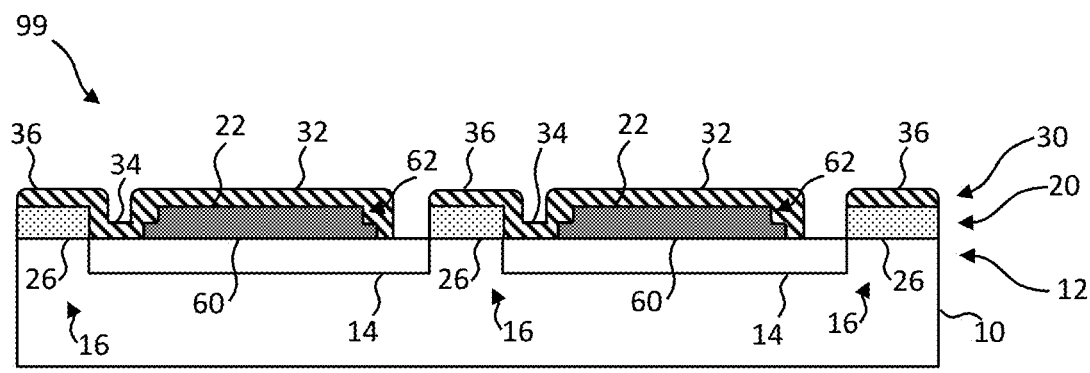

As shown in FIG. 16, lower and upper layers 60, 62 can be the same material or a unitary structure. A lower layer 60 can have a greater extent over a source wafer 10 than upper layer 62 or a device 22, for example, so that a device 22 forms a mesa or pedestal on the lower layer 60. In some embodiments, upper and lower layers 62, 60 are a single substrate material deposited and patterned on the sacrificial portion 14 together and then subsequently processed to form a device 22 (that can include other patterned materials such as dielectrics and metals) in the upper layer 62 without further processing the lower layer 60.

Figure 17:
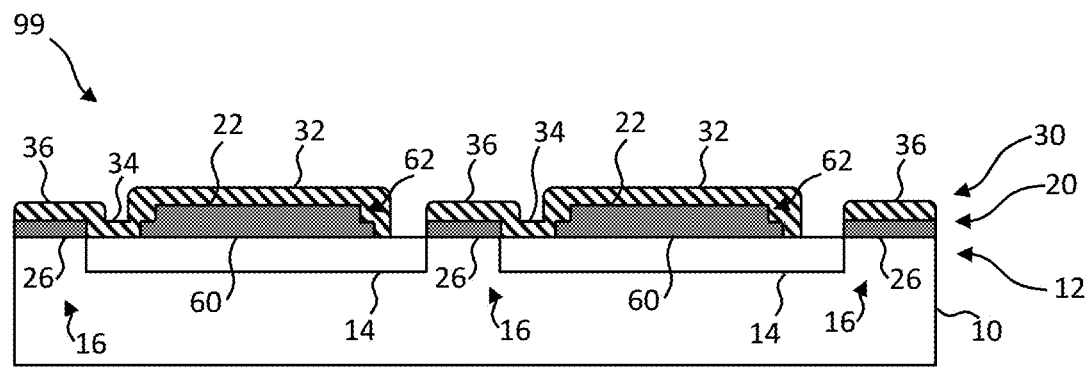

Referring to FIG. 17, the upper and lower layers 62, 60 comprise the same material, for example a semiconductor substrate material such as GaAs and the device anchor 26 comprises the same material. The device anchor 26 can have a thickness (depth) corresponding to the thickness (depth) of the lower level 60 (as shown in FIG. 17) or a depth corresponding to the entire device layer 30.

Figure 18:
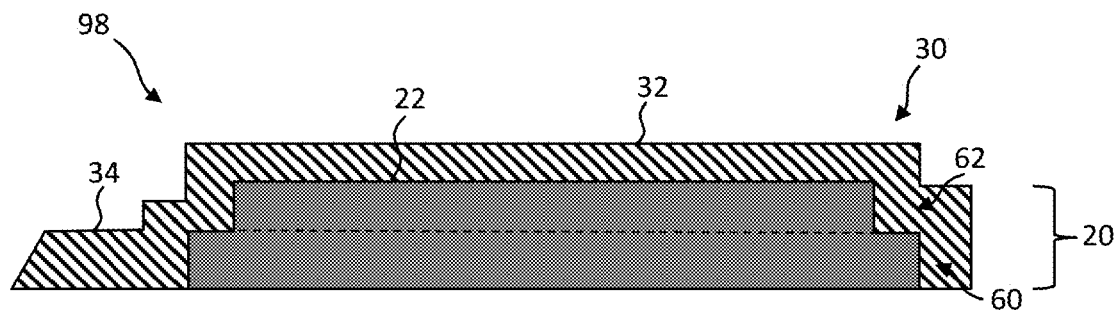
FIG. 18 is a cross section of a device structure, according to illustrative embodiments of the present invention.

As shown in FIG. 18, a device structure 98, for example a micro-transfer printed device 22 removed from the wafer structure 99, comprises a lower layer 60 comprising a semiconductor material having a lateral extent, a patterned upper layer 62 comprising a semiconductor device 22 disposed entirely on the lower layer 60, the semiconductor device 22 comprising the semiconductor material and having a lateral extent less than or equal to the lateral extent of the lower layer 60, and a physically continuous tether structure 30 comprising a tether device portion 32 disposed at least partly on at least one of the device 22, the upper layer 62, and the lower layer 60 and a tether 34 adjacent to, optionally in contact with the lower level 60, and in a common layer with the lower level 60. The semiconductor material can be GaAs and the tether structure 30 can comprise a dielectric.

In some embodiments of the present invention, a source wafer 10 comprises a patterned device layer 20 comprising a GaAs lower layer 60, an upper layer 62 forming a device 22 that also incorporates or comprises GaAs, and a sacrificial portion 14 over which the device 22 is disposed comprising a layer of AlGaAs. The source wafer 10 can be a GaAs wafer. Both the device 22 (upper layer 62) and the sacrificial portion 14 are protected by the lower layer 60. The lower layer 60, if made of GaAs can be patterned using common GaAs etchants, such as phosphoric acid plus peroxide or ammonium hydroxide plus peroxide. AlGaAs can be etched using HCl or HF to release the device 22 from the source wafer 10 with a clean surface on the lower layer 60 for micro-transfer printing to a destination substrate. This method and structure has been demonstrated to enable the construction of micro-transfer printable GaAs devices 22 with good performance and yields.

A device 22 or component 23 can be an active circuit component, for example including one or more active electronic components such as electronic transistors or diodes or light-emitting diodes and photodiodes that produce an electrical current in response to ambient light. Alternatively, a device 22 or component 23 can be a passive component, for example including one or more passive elements such as resistors, capacitors, or conductors. In some embodiments, a device 22 or component 23 includes both active and passive elements. A device 22 or component 23 can be a semiconductor device having one or more semiconductor layers, such as an integrated circuit. A device 22 or component 23 can be an unpackaged die. In some embodiments, a device 22 is a compound device 22 having a plurality of active or passive elements, such as multiple semiconductor components 23 with separate substrates, each with one or more active elements or passive elements, or both. In certain embodiments, the plurality of components 23 is disposed and interconnected on a device substrate 28 separate from the substrates of any semiconductor devices. In certain embodiments, the compound device 22 can be micro transfer printed itself after the components 23 have been arranged thereon. Devices 22 or components 23 can be electronic processors, controllers, drivers, light-emitting diodes, photodiodes, light-control devices, or light-management devices.

Devices 22 or components 23 can include active elements such as electronic circuits formed using lithographic processes and can include passive elements such as electrical connections, e.g., wires 52, to contact pads 50. In certain embodiments, the contact pads 50 are planar electrical connections formed on the process side of the devices 22 or components 23 and source wafer 10. Such contact pads 50 are typically formed from metals such as aluminum or polysilicon using masking and deposition processes used in the art. In certain embodiments, the contact pads 50 are electrically connected to component or device circuits 29 with wires 52. In some embodiments, the contact pads 50 are directly electrically connected to the circuit without intervening wires 52.

In some embodiments of the present invention, devices 22 or components 23 are small integrated circuits, for example chiplets, having a thin substrate with at least one of a thickness of only a few microns, for example less than or equal to 25 microns, less than or equal to 15 microns, or less than or equal to 10 microns, and a width of 5-1000 microns (e.g., 5-10 microns, 10-50 microns, 50-100 microns, or 100-1000 microns) and a length of 5-1000 microns (e.g., 5-10 microns, 10-50 microns, 50-100 microns, or 100-1000 microns). Such chiplets can be made in a native source semiconductor wafer (e.g., a silicon or GaN wafer) having a process side and a back side used to handle and transport the wafer using lithographic processes. The devices 22 or components 23 are formed using lithographic processes in an active layer on or in the process side of the source wafer 10. Methods of forming such structures are described, for example, in U.S. Pat. No. 8,889,485. According to some embodiments of the present invention, component 23 source wafers 10 can be provided with components 23, release layer, and tethers 34 already formed, or they can be constructed as part of the process in accordance with certain embodiments of the present invention.

In some embodiments, devices 22 or components 23 are small integrated circuits formed in a semiconductor wafer, for example gallium arsenide or silicon, which can have a crystalline structure. Processing technologies for these materials typically employ high heat and reactive chemicals. However, by employing transfer technologies that do not stress devices 22 or components 23 or substrate materials, more benign environmental conditions can be used compared to thin-film manufacturing processes. Thus, certain embodiments of the present invention have an advantage in that flexible substrates, such as polymeric substrates, that are intolerant of extreme processing conditions (e.g. heat, chemical, or mechanical processes) can be employed for the destination substrates. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Components 23 can be formed in a microcrystalline, polycrystalline, or amorphous semiconductor layer. In some embodiments, a source wafer 10 is a native source wafer 10 to components 23 or devices 22, for example comprising a semiconductor. In some embodiments, a source wafer 10 is not a native source wafer 10 to components 23 or devices 22, for example comprising a dielectric.

In certain embodiments, devices 22 or components 23 can be constructed using foundry fabrication processes used in the art. Layers of materials can be used, including materials such as metals, oxides, nitrides and other materials used in the integrated-circuit art. Each device 22 or component 23 can be a complete semiconductor integrated circuit and can include, for example, transistors. Components 23 can have different sizes, for example, less than 1000 square microns or less than 10,000 square microns, less than 100,000 square microns, or less than 1 square mm, or larger, and can have variable aspect ratios, for example 1:1, 2:1, 5:1, or 10:1. Components 23 can be rectangular or can have other shapes.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
D direction
G gap
L1, L2 length
T thickness
10 source wafer
12 sacrificial layer
14 sacrificial portion
16 anchor portion
18 ninety-degree angle
20 patterned device layer
22 device
23, 23A, 23B, 23G, 23R component
24 device layer
26 device anchor
28 device substrate
29 device circuit
30 tether structure
31 tether material
32 tether device portion
34 tether
36 tether anchor portion
38 fracture line
40 opening
50 contact pad
52 wire
54 via
60 lower layer
62 upper layer
98 device structure
99 wafer structure
100 provide source wafer step
110 dispose patterned device layer step
120 dispose device on patterned device layer step
122 process patterned device layer to form device step
123 micro-transfer print device in patterned device layer step
124 form device substrate over sacrificial portion step
126 micro-transfer print devices(s) onto device substrate step
128 process devices(s) and device substrate to form device circuit step
130 form tether structure step
140 etch sacrificial portions step
150 contact device with stamp step
160 fracture tether step
170 remove stamp with adhered device step
180 press device against destination substrate step
190 remove stamp step

The invention claimed is:

1. A device structure, comprising:
a lower layer comprising a semiconductor material having a lateral extent;
a patterned upper layer comprising an electrically controllable semiconductor device disposed entirely on the lower layer, wherein the semiconductor device-comprises the semiconductor material and the patterned upper layer has a lateral extent less than or equal to the lateral extent of the lower layer; and
a physically continuous tether structure comprising (i) a tether device portion at least partly on the upper layer and the lower layer and (ii) a fractured tether adjacent to and in a common layer with the lower layer.

2. The device structure of claim 1, wherein the semiconductor material is GaAs.

3. The device structure of claim 2, wherein the tether structure comprises a dielectric.

4. The device structure of claim 1, wherein the semiconductor material comprises one or more of a semiconductor, a compound semiconductor, sapphire, silicon {100}, or silicon {111}.

5. The device structure of claim 1, wherein the semiconductor device is a light-emitting diode or an integrated circuit.

6. The device structure of claim 1, wherein the semiconductor device and the physically continuous tether structure comprise a common material.

7. The device structure of claim 1, wherein the fractured tether is fractured at least partially on a side of the lower layer opposite the upper layer.

8. The device structure of claim 1, wherein the fractured tether is fractured at least in a portion of the continuous tether structure in contact with the lower layer.

9. The device structure of claim 1, wherein a fracture line of the fractured tether is at least partially in contact with the lower layer.

10. The device structure of claim 9, wherein the fracture line extends at least partially or entirely along a side wall or edge wall of the lower layer.

11. The device structure of claim 9, wherein the fracture line is at least partially in contact with a side wall or edge wall of the lower layer.

12. The device structure of claim 1, wherein a fracture line of the fractured tether extends from a top of tether inward toward the lower layer.

13. The device structure of claim 1, wherein a fracture line of the fractured tether is angled.

14. The device structure of claim 1, wherein a fracture line of the fractured tether extends from a corner of the physically continuous tether structure.

\* \* \* \* \*